US008643058B2

(12) United States Patent
Bawendi et al.

(10) Patent No.: US 8,643,058 B2
(45) Date of Patent: Feb. 4, 2014

(54) ELECTRO-OPTICAL DEVICE INCLUDING NANOCRYSTALS

(75) Inventors: Moungi Bawendi, Cambridge, MA (US); Venda J. Porter, Cambridge, MA (US); Marc Kastner, Cambridge, MA (US); Tamar Mentzel, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1391 days.

(21) Appl. No.: 11/831,370

(22) Filed: Jul. 31, 2007

(65) Prior Publication Data

US 2010/0025595 A1 Feb. 4, 2010

Related U.S. Application Data

(60) Provisional application No. 60/820,847, filed on Jul. 31, 2006.

(51) Int. Cl.
*H01L 31/0352* (2006.01)

(52) U.S. Cl.
USPC ........ 257/187; 257/40; 257/21; 257/E31.015; 257/E21.09; 257/E31.033; 438/85; 250/492.2

(58) Field of Classification Search
USPC ...................................... 257/40, 21, E31.015
See application file for complete search history.

(56) References Cited

U.S. PATENT DOCUMENTS

| | | | |
|---|---|---|---|
| 5,260,957 A | 11/1993 | Hakimi et al. | |
| 5,293,050 A | 3/1994 | Chapple-Sokol et al. | |
| 5,354,707 A | 10/1994 | Chapple-Sokol et al. | |
| 5,422,489 A | 6/1995 | Bhargava | |
| 5,505,928 A | 4/1996 | Alivisatos et al. | |
| 5,512,131 A | 4/1996 | Kumar et al. | |
| 5,525,377 A | 6/1996 | Gallagher et al. | |
| 5,537,000 A | 7/1996 | Alivisatos et al. | |
| 5,585,640 A | 12/1996 | Huston et al. | |
| 5,613,140 A | 3/1997 | Taira | |
| 5,677,545 A | 10/1997 | Shi et al. | |
| 5,751,018 A | 5/1998 | Alivisatos et al. | |
| 5,897,945 A | 4/1999 | Lieber et al. | |
| 5,958,573 A | 9/1999 | Spitler et al. | |

(Continued)

FOREIGN PATENT DOCUMENTS

| | | |
|---|---|---|
| WO | WO 96/10282 | 4/1996 |
| WO | WO 97/10175 | 3/1997 |

(Continued)

OTHER PUBLICATIONS

Hoschl et al., Electrical Evaluation of Cadmium Telluride Growth From Tellurium Melt, Nov. 8, 1975, Czech. J. Phys., B26, 1976, pp. 812-821.*

(Continued)

*Primary Examiner* — Jerome Jackson, Jr.
*Assistant Examiner* — Bo Fan
(74) *Attorney, Agent, or Firm* — Steptoe & Johnson LLP

(57) ABSTRACT

An electro-optical device can include a plurality of nanocrystals positioned between a first electrode and a second electrode. The nanocrystal and at least one electrode can have a band gap offset sufficient to inject a charge carrier from the first electrode or second electrode into the nanocrystal. The device can be a secondary photoconductor.

7 Claims, 15 Drawing Sheets

(56) References Cited

U.S. PATENT DOCUMENTS

| | | | |
|---|---|---|---|
| 6,103,868 | A | 8/2000 | Heath et al. |
| 6,157,047 | A | 12/2000 | Fujita et al. |
| 6,180,239 | B1 | 1/2001 | Whitesides et al. |
| 6,207,229 | B1 | 3/2001 | Bawendi et al. |
| 6,236,060 | B1 | 5/2001 | Chan et al. |
| 6,251,303 | B1 | 6/2001 | Bawendi et al. |
| 6,294,401 | B1 | 9/2001 | Jacobson et al. |
| 6,322,901 | B1 | 11/2001 | Bawendi et al. |
| 6,379,635 | B2 | 4/2002 | O'Brien et al. |
| 6,447,698 | B1 | 9/2002 | Ihara et al. |
| 6,501,091 | B1 | 12/2002 | Bawendi et al. |
| 6,518,168 | B1 | 2/2003 | Clem et al. |
| 6,576,291 | B2 | 6/2003 | Bawendi et al. |
| 6,607,829 | B1 | 8/2003 | Bawendi et al. |
| 6,617,583 | B1 | 9/2003 | Bawendi et al. |
| 6,759,199 | B2 | 7/2004 | Mirkin et al. |
| 6,797,412 | B1 | 9/2004 | Jain et al. |
| 6,803,719 | B1 | 10/2004 | Miller et al. |
| 6,846,565 | B2 | 1/2005 | Korgel et al. |
| 6,864,626 | B1 | 3/2005 | Weiss et al. |
| 7,160,613 | B2 | 1/2007 | Bawendi et al. |
| 7,229,690 | B2 | 6/2007 | Chan et al. |
| 2001/0005495 | A1 | 6/2001 | O'Brien et al. |
| 2003/0017264 | A1 | 1/2003 | Treadway et al. |
| 2003/0042850 | A1 | 3/2003 | Bertram et al. |
| 2003/0142944 | A1 | 7/2003 | Sundar et al. |
| 2004/0004982 | A1 | 1/2004 | Eisler et al. |
| 2004/0017834 | A1 | 1/2004 | Sundar et al. |
| 2004/0023010 | A1 | 2/2004 | Bulovic et al. |
| 2004/0091710 | A1 | 5/2004 | Bawendi et al. |
| 2004/0110002 | A1 | 6/2004 | Kim et al. |
| 2004/0265622 | A1 | 12/2004 | Sadasivan et al. |
| 2005/0258418 | A1 | 11/2005 | Steckel et al. |
| 2006/0019098 | A1 | 1/2006 | Chan et al. |
| 2006/0159901 | A1 | 7/2006 | Tischler et al. |
| 2006/0196375 | A1 | 9/2006 | Coe-Sullivan et al. |

FOREIGN PATENT DOCUMENTS

| | | |
|---|---|---|
| WO | WO 99/26299 | 5/1999 |
| WO | WO 2005004253 | 1/2005 |
| WO | WO 2005017951 | 2/2005 |

OTHER PUBLICATIONS

Adachi et al., "High-efficiency red electrophosphorescence devices", Appl. Phys. Lett. 78, 1622 (2001).
Aktsipetrov et al. "Generation of reflected second harmonic at semiconductor quantum dots," JETP Letters, vol. 55, No. 8, 435-439 (1992).
Alivisatos, "Perspectives on the Physical Chemistry of Semiconductor Nanocrystals" J. Phys. Chem. 1996(100):13226-13239, 1996.
Baltramiejunas et al., "Rapid Processes of Darkening and Bleaching in CdS Doped Glasses," Superlattices and Microstructures vol. 10, No. 3, 307-310 (1990).
Baltrameyunas et al., "Fast switching of the transmission of light by glasses activated with CdS microcrystals," Sov. Phys. Semicond., vol. 25 No. 2, 164-166 (1991).
Bhargava et al., "Quantum Confined Atoms of Doped ZnO Nanocrystals", Phys. Stat. Sol (b) 229, No. 2, 897-901 (2002).
Bube, Photoconductivity of Solids, 1960, New York (Wiley).
Bulović et al., Semiconductors and Semimetals 64, 255 (2000).
Chamarro et al., "Enhancement of Exciton Exchange Interaction by Quantum Confinement in CdSe Nanocrystals," Jpn. J. Appl. Phys, vol. 34, 12-14 (1994).
Chamarro et al., "Size-dependent Electron-Hole Exchange Interaction in CdSe Quantum Dots, Il Nuovo Cimento," vol. 17, Nos. 11-12, (1995) 1407-1412.
Chamarro et al., "Enhancement of electron-hole exchange interaction in CdSe nanocrystals; A quantum confinement effect," Physical Review B, vol. 53, No. 3, Jan. 15, 1996-I, 1336-1342.

Chan et al., "Multiexcitonic two-state lasing in a CdSe nanocrystal laser," Applied Physics Letters 85:2460 (2004).
Chan et al., "Blue semiconductor nanocrystal laser," Applied Physics Letters 86:073102 (2005).
Chepic et al., "Auger ionization of semiconductor quantum drops in a glass matrix," Journal of Luminescence 47 (1990) 113-127 North-Holland.
Coe et al., "Electroluminescence from single monolayers of nanocrystals in molecular organic devices," Nature 2002, 420, 800-803.
Coe-Sullivan et al., "Large-Area Ordered Quantum-Dot Monolayers via Phase Separation During Spin-Casting", Advanced Functional Materials, 15, 1117-1124 (2005).
Colvin et al., "Light-emitting diodes made from cadmium selenide nanocrystals and a semiconducting polymer" Nature 370(6488):354-357, Aug. 4, 1994.
D'Andrade et al., "Bright White Electrophosphorescent Triple-Emissive Layer Organic Light Emitting Device", MRS Fall Meeting, BB6.2 (2001).
Dabbousi et al., "Langmuir-Blodgett Manipulation of Size-Selected CdSe Nanocrystallites," Chem. Mater. 1994, 6, 216-219.
Dabbousi et al., "Electroluminescence from CdSe quantum-dot/polymer composites" Appl. Phys. Lett. 66(11):1316-1318, Mar. 13, 1995.
Dabbousi et al., "(CdSe)ZnS Core-Shell Quantum Dots: Synthesis and Characterization of a Size Series of Highly Luminescent Nanocrystallites", J. Phys. Chem. B. 101, 9463 (1997).
Dahan et al., "Diffusion Dynamics of Glycine Receptors Revealed by Single-Quantum Dot Tracking ," Science 2003, 302, 442-445.
Danek et al., "Synthesis of Luminescent Thin-Film CdSe/ZnSe Quantum Dot Composites Using CdSe Quantum Dots Passivated with an Overlayer of ZnSe" Chem. Mater. 8(1):173-180, 1996.
Dirr et al., "Organic Light Emitting Diodes with Reduced Spectral and Spacial Halfwidths", Jpn. J. Appl. Phys. 37, 1457 (1998).
Diehl, "Fraunhofer LUCOLEDs to replace lamps," III-Vs Rev. 10(1), 1997.
Dneproviskii et al., "Time-Resolved Luminescence of CdSe Microcrystals," Solid State Communications, vol. 74, No. 7, pp. 555-557 (1990).
Drndic et al., "Transport properties of annealed CdSe colloidal nanocrystal solids," Journal of Applied Physics 2002, 92, 7498.
Dubertret et al., "In Vivo Imaging of Quantum Dots Encapsulated in Phospholipid Micelles" Science 298:1759 (2002).
Edamatsu et al., "Subpicosecond dynamics of confined excitons and optical nonlinearities of CuCl quantum dots," Journal of Luminescence 66 & 67 (1996) 406-409.
Efros et al., "Resonance Raman Spectroscopy of Electron-Hole Pairs—Polar Phonon Coupling in Semiconductor Quantum Microcrystals," Solid State Communications, vol. 78, No. 10, 853-856 (1991).
Eisler et al., "Color-selective semiconductor nanocrystal laser," Applied Physics Letters 80:4614 (2002).
Ekimov et al., "Quantum size effect in three-dimensional microscopic semiconductor crystals," JETP Lett, vol. 34, No. 6, Sep. 20, 1981, pp. 345-349.
Ekimov et al., "Quantum size effect in the optical spectra of semiconductor microcrystals," Sov. Phys. Semicond. 16(7), Jul. 1982, pp. 775-778.
Ekimov et al., "Size quantization of the electron energy spectrum in a microscopic semiconductor crystal," JETP Lett., vol. 40, No. 8, Oct. 25, 1984, pp. 1136-1139.
Ekimov et al., "Quantum Size Effect in Semiconductor Microcrystals," Solid State Communications, vol. 56, No. 11, pp. 921-924 (1985).
Ekimov et al., "Quantization of the energy spectrum of holes in the adiabatic potential of the electron," JETP Lett., vol. 43, No. 6, Mar. 25, 1986, pp. 376-379.
Ekimov et al., "Nonlinear Optics of Semiconductor-Doped Glasses," Phys. Stat. Sol. (b) 150, (1988) pp. 627-633.
Ekimov et al., "Photoluminescence of quasizero-dimensional semiconductor structures," Sov. Phys. Solid State 31(8), Aug. 1989, pp. 1385-1393.

(56) References Cited

OTHER PUBLICATIONS

Ekimov et al., "Donor-like Exciton in Zero-Dimension Semiconductor Structures," Solid State Communications, vol. 69, No. 5, pp. 565-568 (1989).
Ekimov et al., "Influence of high hydrostatic pressures on the exciton spectrum of CdS microcrystals in glass," Sov. Phys. Semicond. 23(9), Sep. 1989, pp. 965-966.
Ekimov et al., "Quantum-Size Stark Effect in Semiconductor Microcrystals," Journal of Luminescence 46 (1990) 97-100 North-Holland.
Ekimov et al., "Spectra and Decay Kinetics of Radiative Recombination in CdS Microcrystals," Journal of Luminescence 46 (1990) 83-95 North-Holland.
Ekimov et al., "Optics of Zero Dimensional Semiconductor Systems, Acta Physica Polonica A," vol. 79 (1991), No. 1. pp. 5-14.
Ekimov, "Optical Properties of Semiconductor Quantum Dots in Glass Matrix," Physica Scripta, vol. T39, 217-222 (1991).
Ekimov et al., "Dimensional Effects in Luminescence Spectra of Zero-Dimensional Semiconductor Structures," Bulletin of the Russian Academy of Sciences, vol. 56, No. 2, pp. 154-157 (Feb. 1992).
Ekimov et al., "Absorption and intensity-dependent photoluminescence measurements on CdSe quantum dots: assignment of the first electronic transitions," Journal of the Optical Society of America, vol. 10, Nos. 1-12, 100-107 (1992).
Ekimov et al., "Growth of CdSe nanocrystals in ion-implanted $SiO_2$ films," Journal of Crystal Growth 151 (1995) 38-45.
Ekimov, "Optical Properties of Oxide Glasses Doped by Semiconductor Nanocrystals," Radiation Effects and Defects in Solids, 1995, vol. 134, 11-22.
Ekimov, "Growth and optical properties of semiconductor nanocrystals in a glass matrix," Journal of Luminescence 70 (1996) 1-20.
Empedocles et al, "Photoluminescence Spectroscopy of Single CdSe Nanocrystallite Quantum Dots" Phys. Rev. Lett. 77(18):3873-3876 (Oct. 1996).
Empedocles et al., "Quantum-Confined Stark Effect in Single CdSe Nanocrystallite Quantum Dots" Science 278:2114-2117 (Dec. 1997).
Grabovskis, et al., "Photoionization of semiconducting microcrystals in glass," Sov. Phys. Solid State 31(1), Jan. 1989, pp. 149-151.
Guha et al., "Hybrid organic-inorganic semiconductor-based light-emitting diodes" J. Appl. Phys. 82(8):4126-4128 (Oct. 15, 1997).
Gurevich et al., "Growth of CdS nanocrystals in silicate glasses and in thin $SIO_2$ films in the Initial states of the phase separation of a solid solution," Semiconductors, 28 (5), May 1994, 486-493.
Gurevich et al. "Preparation and investigation of $SIO_2$ films activated by CdS semiconductor nanocrystals," Soviet Physics Semiconductors, vol. 26, 57-59 (1992).
Guyot-Sionnest et al., "Fast Voltammetric and Electrochromic Response of Semiconductor Nanocrystal Thin Films" Journal of Physical Chemistry B 107:7355 (2003).
Hines et al., "Synthesis and Characterization of Strongly Luminescing ZnS-Capped CdSe Nanocrystals" J. Phys. Chem. 100:468-471 (Jan. 1996).
Itoh et al., "Interface effects on the properties of confined excitons in CuCl microcrystals," Journal of Luminescence 60 & 61 (1994) 396-399.
Itoh et al., "Polaron and Exciton-Phonon Complexes in CuCl Nanocrystals," Physical Review Letters, vol. 74, No. 9, Feb. 27, 1995, 1645-1648.
Itoh et al., "Subpicosecond dynamics of confined excitons in CuCl nanocrystals," Materials Science and Engineering A217/218 (1996) 167-170.
Jaiswal et al. "Long-term multiple color imaging of live cells using quantum dot bioconjugates," Nature Biotechnology, vol. 21, No. 1, 47-51 (Jan. 2003).
Jarosz et al., "Observation of Bimolecular Carrier Recombination Dynamics in Close-Packed Films of Colloidal CdSe Nanocrystals," Journal of Physical Chemistry B 107:12585 (2003).
Jarosz et al., "Photoconductivity studies of treated CdSe quantum dot films exhibiting increased exciton ionization efficiency," Physical Review B 70, 195327 (2004).
Jarosz et al., Thesis, Massachusetts Institute of Technology (2004).
Jursenas et al., "Surface Recombination of Nonequilibrium Electron-Hole Plasma in Laser-Modified Semiconductor-Doped Glasses," Solid State Communications, vol. 87, No. 6, 577-580 (1993).
Kagan et al., "Electronic Energy Transfer in CdSe Quantum Dot Solids," Physical Review Letters, 76:1517-1520 (1996).
Kagan et al., Thesis, Massachusetts Institute of Technology (1996).
Kagan et al., "Long-range resonance transfer of electronic excitations in close-packed CdSe quantum-dot solids," Physical Review Letters, 54:8633-8643 (Sep. 15, 1996).
Kim et al., "Near-infrared fluorescent type II quantum dots for sentinel lymph node mapping," Nature Biotechnology 22:93 (2004).
Kortan et al., "Nucleation and Growth of CdSe on ZnS Quantum Crystallite Seeds, and Vice Versa, In Inverse Micelle Media" J. Am Chem. Soc. 112:1327-1332 (1990).
Kuno et al., "The band edge luminescence of surface modified CdSe nanocrystallites: Probing the luminescing state" J. Chem. Phys. 106(23):9869-9882 (Jun. 1997).
Landolt et al., Numerical Data and Functional Relationships in Science and Technology. 1961, Berlin: Springer-Verlag.
Larson et al., "Water-Soluble Quantum Dots for Multiphoton Fluorescence Imaging in Vivo," *Science*, vol. 300, 1434-1436 (May 30, 2003).
Lawless et al., "Bifunctional Capping of CdS Nanoparticles and Bridging to TiO2" J. Phys. Chem. 99:10329-10335 (1995).
Leatherdale et al., "Photoconductivity in CdSe Quantum Dot Solids," vol. 62, No. 4, pp. 2669-2680, (Jul. 15, 2000).
Lublinskaya et al., "CdS nanocrystal growth in thin silica films: evolution of size distribution function", Journal of Crystal Growth 184/185 (1998) 360-364.
Matsumoto et al., "Preparation of Monodisperse CdS Nanocrystals by Size Selective Photocorrosion", J. Phys. Chem.100(32):13781-13785 (1996).
Mattoussi et al., "Electroluminescence from heterostructures of poly(phenylene vinylene) and inorganic CdSe nanocrystals," J. Appl. Phys. 83(12): 7965-7974, 1998.
Morgan et al, "Electronic Transport in Films of Colloidal CdSe NCs," *Phys. Rev. B* 66, 075339-1 (2002).
Murray et al., "Synthesis and Characterization of Nearly Monodisperse CdE (E=S, Se, Te) Semiconductor Nanocrystallites", J. Am. Chem. Soc. 115(19):8706-8715 (1993).
Murray et al., "Self-Organization of CdSe Nanocrystallites into Three-Dimensional Quantum Dot Superlattices," Science 270, 1335 (1995).
Murray et al., Annu. Rev. Mat. Sci. 2000, 30, 545-610.
Nirmal et al., "Fluorescence Intermittency in single Cadmium Selenide Nanocrystals" Nature 383:802-804 (Oct. 1996).
Novikov et al., "Lévy statistics and anomalous transport in quantum-dot arrays," Physics Review B 72:075309 (2005).
Parungo et al., The Journal of Thoracic and Cardiovascular Surgery, 2004.
Parungo et al., Sentinel Lymph Node Mapping of the Pleural Space, Chest 127:1799 (2005).
Saviot et al., "Effects of Resonance on Low-Frequency Raman Scattering From Semiconductor Nanocrystals," Radiation Effects and Defects in Solids, 1995, vol. 137, 45-50.
Saviot et al., "Size dependence of acoustic and optical vibrational modes of CdSe nanocrystals in glasses," Journal of Non-Crystalline Solids 197 (1996) 238-246.
Saviot et al., "Size-selective resonant Raman scattering in CdS doped glasses," Physical Review B, vol. 57, No. 1, Jan. 1, 1998-I, 341-346.
Schlamp et al., "Improved efficiencies in light emitting diodes made with CdSe(CdS) core/shell type nanocrystals and a semiconducting polymer", J. Appl. Phys., 82, 5837-5842 (1997).
Sirenko et al., "Spin-flip and acoustic-phonon Raman scattering in CdS nanocrystals", Physical Review B, vol. 58, No. 4, 15 (Jul. 1998-II), 2077-2087.
Snee et al., "Whispering-Gallery-Mode Lasing From a Semiconductor Nanocrystal/Microsphere Resonator Composite," *Advanced Materials*, May 2, 2005, vol. 17, No. 9 pp. 1131-1136.

(56) References Cited

OTHER PUBLICATIONS

Soltesz et al., "Intraoperative Sentinel Lymph Node Mapping of the Lung Using Near-Infrared Fluorescent Quantum Dots," The Annals of Thoracic Surgery 2005, 79: 269-277.

Spanhel et al., "Photochemistry of Colloidal Semiconductors. Surface Modification and Stability of Strong Luminescing CdS Particles" J. Am. Chem. Soc.109(19):5649-5655 (1987).

Sundar et al., Adv. Mater. 2002, 14, 739-743.

Sundar et al., "Soft-Lithographically Embossed, Multilayered Distributed-Feedback Nanocrystal Lasers," *Advanced Materials*, Dec. 27, 2004, vol. 16, No. 23-24, pp. 2137-2141.

Tamulaitis et al., "Dynamics of Nonlinear Optical Response of CuBr-Doped Glasses," Superlattices and Microstructures, vol. 3, No. 2, 199-202 (1993).

Valenta et al., "Dynamics of excitons in CuBr nanocrystals: Spectral-hole burning and transient four-wave-mixing measurements," Physical Review B, vol. 57, No. 3, Jan. 15, 1998-I, 1774-1783.

Vandyshev et al., "Nonlinear optical properties of semiconductor microcrystals," JETP Lett., vol. 46, No. 10, Nov. 25, 1987 pp. 435-439.

Volkov et al., "Oscillations of polarization of recombination radiation of a variable gap semiconductor in a magnetic field," JETP Lett., vol. 25 No. 55, 526-528 (1977).

Wehrenberg et al., "Electron and Hole Injection in PbSe Quantum Dot Films," Journal of the American Chemical Society 125:7806 (2003).

Yamasaki et al., "Organic light-emitting device with an ordered monolayer of silica microspheres as a scattering medium", Appl. Phys. Lett. 76, 1243-1245 (2000).

Yu et al., "n-Type Conducting CdSe Nanocrystal Solids," Science 300:1277 (2003).

\* cited by examiner

US 8,643,058 B2

ELECTRO-OPTICAL DEVICE INCLUDING NANOCRYSTALS

CLAIM OF PRIORITY

This application claims priority to provisional U.S. Patent Application No. 60/820,847, filed Jul. 31, 2006, which is incorporated by reference in its entirety.

FEDERALLY SPONSORED RESEARCH OR DEVELOPMENT

This invention was made with government support under Contract Nos. DMR-0213282and PHY0117795 from the National Science Foundation, and DAAD19-02-D-0002 from the United States Army. The government has certain rights in the invention.

TECHNICAL FIELD

The invention relates to an electro-optical device.

BACKGROUND

Electro-optical devices are structures that have electrical properties that change when contacted with electromagnetic radiation, or optical properties that change with application of an electric field. Examples of electro-optical devices include photodetectors, which can be made from materials that generate secondary, rather than primary photocurrents. In a secondary photoconductor, one of the charge carriers is more mobile than the other and cycles through the circuit amplifying the current until it recombines with the slower carrier. In order to observe secondary photocurrents the mobile carrier must be able to be injected from electrodes into the photoconductor.

SUMMARY

In one aspect, an electro-optical device includes a first electrode and a second electrode, the first electrode and the second electrode being positioned on a surface of a substrate, and a plurality of nanocrystals positioned between the first electrode and the second electrode. The nanocrystal and at least one electrode have a band gap offset sufficient to inject a charge carrier from the first electrode or second electrode into the nanocrystal.

In another aspect, a method of generating photocurrent includes providing a device including a first electrode and a second electrode, the first electrode and the second electrode being positioned on a surface of a substrate, and a plurality of nanocrystals positioned between the first electrode and the second electrode, applying a voltage between the first electrode and the second electrode, and exposing the nanocrystals to irradiation. The nanocrystal and at least one electrode have a band gap offset sufficient to inject a charge carrier from the first electrode or second electrode into the nanocrystal.

In another aspect, a method of producing an electro-optical device includes exposing a surface including a plurality of nanocrystals to a solution including a ligand for the nanocrystal or heating a surface including a plurality of nanocrystals, or both. The ligand can be a base. The ligand can be butylamine, aniline, 1,6-diaminohexane, 1,4-phenylenediamine, tri-n-butylphosphine, or a hydroxide salt. The ligand can be an amine, for example, a $C_{2-6}$ alkyl amine. Heating can include raising the temperature of the surface to 100° C. or higher. Alternatively, the nanocrystal can be passivated with an inorganic overcoating and subjected to a treatment to remove the ligand. The ligand can be removed by thermal annealing or by any chemical ligand removal method.

In certain embodiments, the device can include one or more of the following features. The nanocrystal can be a CdTe nanocrystal. The first electrode and the second electrode can be gold. The substrate can be a dielectric layer. The device can include a third electrode positioned on the dielectric layer and opposite the first electrode and second electrode. The third electrode can be a doped semiconductor or transparent electrode. The plurality of nanocrystals can form a layer. The device can include a field effect transistor or a secondary photoconductor.

The core can include a nanoparticle. The nanoparticle can include a semiconductor nanocrystal (or quantum dot). Within the device, the nanoparticle can form a layer, for example a monolayer or multiple layers, on a substrate. The nanocrystal can be a semiconductor material, for example, a binary or ternary semiconductor material.

The electro-optical device can be a simple, low cost device fabrication since the organic layer and active layer can be prepared in a single step. The conductivity of the active layer can be tuned, which can improve the retention characteristics of the device. The structure of the device can enable the use of thinner structures.

Advantageously, a close-packed film of CdTe nanocrystals in a field-effect structures exhibits photoconductivity in the presence of light. The majority carriers can be holes that are injected from gold electrodes into the CdTe nanocrystal films, and that the hole density can be modulated with gate voltage. Secondary photocurrents can have a photoconductive gain of ~10 at $10^6$ V/cm showing that the hole mobility can be higher than the electron mobility. A single phenomenological description of the field dependence of the hole mobility can explain the dependence of current on source-drain voltage for both dark and light currents.

The details of one or more embodiments are set forth in the description below. Other features, objects, and advantages will be apparent from the description and from the claims.

BRIEF DESCRIPTION OF DRAWINGS

FIG. 1a is a top view. FIG. 1b is a cross sectional view.

DETAILED DESCRIPTION

Figure 1:
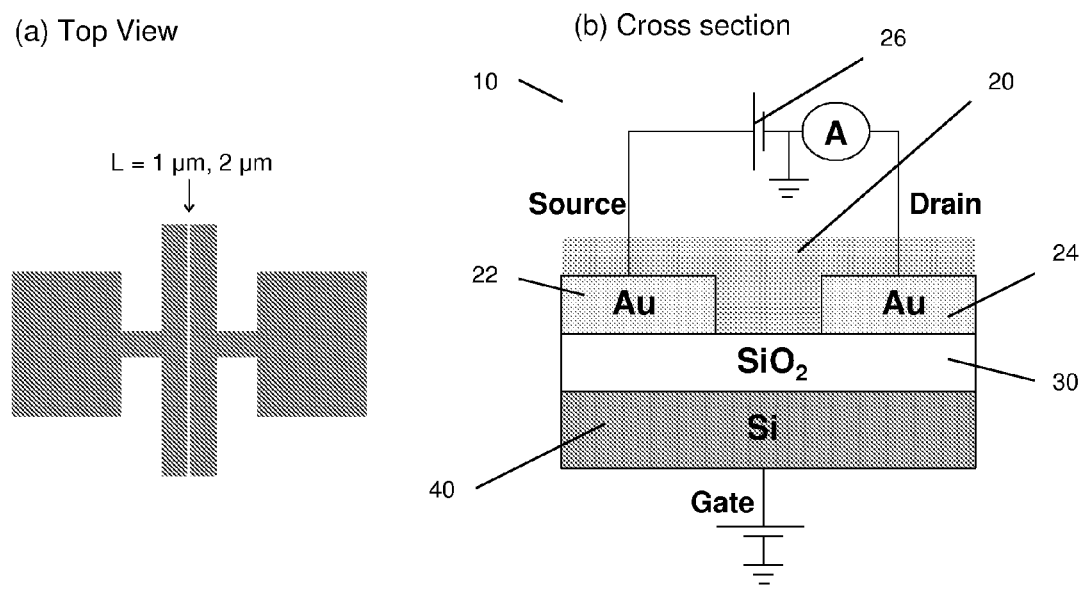
FIGS. 1a and 1b are schematic drawings depicting a nanocrystal-based field effect transistor.

Semiconductor nanocrystals have generated much interest as a potential electro-optical material because of their tunable absorption spectra and because they can be processed in, and deposited from, solution. A nanocrystalline electro-optical device, such as a photodetector, would work by absorbing light as an exciton which would then be separated into a free electron and hole by an applied electric field. The electron and hole can be moved through the film by the applied field, generating current. However, previous work has shown that nanocrystalline films as deposited are insulating. The low conductivity is a result of poor exciton separation due to the large distance between nanocrystals in the film. Studies have shown that conductivity of CdSe nanocrystal films can be enhanced by decreasing interparticle spacing through a partial cap exchange of the TOPO capping ligand with a shorter chain ligand, such as an amine, for example, butylamine, or with a hydroxide salt, for example sodium hydroxide, or through inorganic passivation. For example, conductivity in the CdSe nanocrystal films between gold electrodes increased by three orders of magnitude after post-deposition chemical treatment with butylamine. In another example, treatment with sodium hydroxide increased the photocurrent by a factor of up to 5100. In addition, inorganic passivation of CdSe cores with ZnS shells, followed by thermal annealing can also significantly reduce the interparticle spacing between the CdSe nanocrystal cores. Furthermore, CdSe/ZnS nanocrystal films allow the use of this material as a room temperature photodetector. In certain examples, the photocurrent is larger at room temperature for a CdSe/ZnS nanocrystal film annealed at 300° C. Photocurrent in CdSe nanocrystal thin films with gold electrodes is primary, meaning that the increase of current with voltage plateaus when each electron and hole reaches an electrode and are extracted from the device. This puts a limit on the amount of current which can be generated from a device by increasing the voltage.

Photodetectors are commonly made from materials that generate secondary, rather than primary photocurrents. In a secondary photoconductor, one of the charge carriers is more mobile than the other and cycles through the circuit amplifying the current until it recombines with the slower carrier. In order to observe secondary photocurrents the mobile carrier can be injected from the electrodes. To enhance the performance of nanocrystal electro-optical devices it is desirable to find a nanocrystal thin film system which exhibits secondary photocurrents and a high photoconductive gain. Photoconductive gain is the measure of the current amplification.

For example, CdTe nanocrystal thin films between gold electrodes display secondary photocurrent with an observed gain of 10 after chemical treatment with butylamine. The majority carrier in this system is the hole, as determined from differential conductance measurements. In bulk CdTe the electron is the more mobile carrier and we would expect this to be the case in the nanocrystal film as well. The fact that the hole is more mobile implies that the electron is slowed by surface traps or other defect sites in the film potentially created during the cap exchange/mild etching with butylamine.

The technology we propose here is the generation of sensitive photodetectors based on secondary photocurrents in nanocrystal thin films through the selection of a nanocrystal film in which one carrier is more mobile than the other and the more mobile carrier can be injected from the electrodes.

Semiconductor nanocrystals (NCs) are fluorescent nanoparticles having a discrete energy structure caused by the confinement of the exciton. The emission from nanocrystals can be tuned by varying their size. Applications for nanocrystals have been demonstrated in a variety of fields ranging from biological imaging to novel lasing devices. See, for example, E. G. Soltesz et al., *The Annals of Thoracic Surgery* 79:269 (2005), Parungo et al., *The Journal of Thoracic and Cardiovascular Surgery* 129:844 (2005), Parungo et al., *Sentinel Lymph Node Mapping of the Pleural Space* 127:1799 (2005), Dahan et al., *Science* 302: 442 (2003), Larson et al., *Science* 300:1434 (2003), Jaiswal et al., *Nature Biotechnology* 21:47 (2003), Dubertret et al., *Science* 298:1759 (2002), Kim et al., *Nature Biotechnology* 22:93 (2004), Eisler et al., *Applied Physics Letters* 80:4614 (2002), Sundar et al., *Advanced Materials* 14:739 (2002), Sundar et al., *Advanced Materials* 16:2137 (2004), Snee et al., *Advanced Materials* 17:1131 (2005), Chan et al., *Applied Physics Letters* 86:073102 (2005), and Chan et al., *Applied Physics Letters* 85:2451 (2004), each of which is incorporated by reference in its entirety. Many of the possible applications for nanocrystals, such as light emitting diodes and photodetectors, involve the transport of charge through films of nanocrystals. Recent research has been directed towards better understanding the electronic conduction in nanocrystal films, not only to engineer better devices, but also from a basic scientific interest in how the movement of charge through a solid built of artificial atoms differs from conduction in a solid composed of natural atoms.

A roadblock in the study of conductance in nanocrystal solids has been the insulating nature of the films. CdSe nanocrystal films have been doped with excess charge in an electrochemical cell and excess charge created with photoexcitation in order to generate currents large enough to study. See, for example, Guyot-Sionnest et al., *Journal of Physical Chemistry B* 107:7355 (2003), Yu et al., *Science* 300:1277 (2003), Wehrenberg et al., *Journal of the American Chemical Society* 125:7806 (2003), Kagan, Thesis Massachusetts Institute of Technology (1996), Leatherdale et al., *Physical Review B* 62, 2669 (2000), and Jarosz et al., *Journal of Physical Chemistry B* 107:12585 (2003), each of which is incorporated by reference in its entirety. The magnitude of the photocurrent has been enhanced by annealing the nanocrystals to decrease interdot spacing and, most recently, by a series of post-deposition chemical treatments which increase surface passivation and also decrease interdot spacing. See, for example, Drndic et al., *Journal of Applied Physics* 92:7498 (2002), which is incorporated by reference in its entirety. The chemical treatments increase the photocurrent by over three orders of magnitude to levels where it saturates with applied field. See, for example, Jarosz et al., *Journal of Physical Chemistry B* 107:12585 (2003), which is incorporated by reference in its entirety. The saturation with a photoconductive gain equal to unity shows that the photocurrent in CdSe nanocrystal films is primary, meaning charge can be extracted but not injected into the photoconductor from the gold electrodes used in the experiments. See, for example, Jarosz et al., *Journal of Physical Chemistry B* 107:12585 (2003), and Bube, *Photoconductivity of Solids*, 1960, New York: Wiley, each of which is incorporated by reference in its entirety. While high photocurrent with no underlying dark current is an ideal characteristic for an application like photodetection, the fact that gold forms a blocking contact with CdSe nanocrystals limits the study of the intrinsic transport properties of the films.

Unlike the CdSe nanocrystal system, CdTe nanocrystal films form non-blocking contacts with gold electrodes. By making the film the channel of a field effect transistor (FET), the dominant charge carriers in CdTe nanocrystal films can be holes and that the density of holes can be changed by applying a voltage to the gate. The effect of trapping on the dark current and photocurrent, and the results from photocurrent studies on the CdTe nanocrystal films can be deduced from experimental results. Secondary photocurrents are observed in the CdTe nanocrystal films, and they are examined and contrasted with the photocurrent in CdSe nanocrystal films. In addition, a single phenomenological description of the field dependence of the rate of tunneling between nanocrystals fits the voltage dependence of the current for both the dark current and the photocurrent. Referring to FIG. 1, an electro-optical device 10 includes a plurality of nanocrystals 20 disposed between a first electrode 22 and a second electrode 24. A voltage 26 can be applied across the first electrode 22 and the second electrode 24. When the nanocrystals 20 are irradiated with light having a wavelength that is absorbed by the nanocrystals, a photoinduced current can be generated between the electrodes. The plurality of nanocrystals can be deposited on a substrate 30. The substrate 30 can be a dielectric layer. A third electrode 40 can be positioned on the dielectric layer and opposite the first electrode 22 and second electrode 24. When a drain voltage is applied between the third electrode 40 and either of the first electrode 22 and the second electrode 24, the device 10 can operate as a field-effect transistor.

The nanocrystal and at least one electrode have a band gap offset sufficient to inject a charge carrier from the first electrode or second electrode into the nanocrystal. The charge carrier can be a hole or an electron. The ability of the electrode to inject a charge carrier permits the photoinduced current to flow in a manner that facilitates photodetection.

The substrate can be opaque or transparent. The substrate can be rigid or flexible. The first electrode can have a thickness of about 500 Angstroms to 4000 Angstroms. The first layer can have a thickness of about 50 Angstroms to about 5 micrometers, such as a thickness in the range of 100 Angstroms to 100 nm, 100 nm to 1 micrometer, or 1 micrometer to 5 micrometers. The second layer can have a thickness of about 50 Angstroms to about 5 micrometers, such as a thickness in the range of 100 Angstroms to 100 nm, 100 nm to 1 micrometer, or 1 micrometer to 5 micrometers. The second electrode can have a thickness of about 50 Angstroms to greater than about 1000 Angstroms. Each of the electrodes can be a metal, for example, copper, aluminum, silver, gold or platinum, or combination thereof, a doped oxide, such as an indium oxide or tin oxide, or a semiconductor, such as a doped semiconductor, for example, p-doped silicon. A dielectric layer can include a material selected for its insulating properties and compatibility with device manufacturing procedures. Some exemplary dielectric materials include, without limitation, a metal oxide (e.g., a silicon oxide), and a wide band gap polymer (e.g., polymethylmethacrylate). The dielectric layer can be an insulator, such as an oxide, for example, silicon dioxide, titanium dioxide, or combinations thereof. The plurality of nanocrystals can be a single particle size distribution of charge trapping material, or a single composition of charge trapping material, or a plurality of particle size distributions or compositions of charge trapping material having electronically indistinguishable band gaps. In other embodiments, the plurality of nanocrystals can include a plurality of particle size distributions or compositions having electronically distinguishable band gaps. The tunable nature of the band gap of semiconductor nanocrystals makes these materials a desirable choice when building this type of device.

A gate structure includes a gate width, which can be between 0.1 microns to 4 microns, or less than 2 microns. For example, the width can be between 1 micron and 2 microns. The thickness of a layer formed from the plurality of nanocrystals and the dielectric layer can be, for example, in the range of 3-100 nanometers, or 4-8 nanometers. In certain embodiments, the thickness can be 3-12 nanometers, or 3-6 nanometers. The thickness of the dielectric layer can be chosen to allow the third electrode to apply a voltage that regulates current flow between the first electrode and the second electrode.

The outer surface of the nanoparticle includes an outer layer. The outer layer can be derived from the coordinating solvent used during the growth process, or can be applied by ligand exchange. For example, the surface can be modified by exposure (for example, repeated exposure) to an excess of a competing coordinating group. The plurality of nanocrystals on a surface can be exposed to a ligand for the nanocrystal.

Exposing a surface including a plurality of nanocrystals can exchange the ligand for the nanocrystal, which can modify one or more of the optical and electrical properties of a layer including the plurality of nanocrystals. The ligand can be smaller than the ligand on the outer layer, thereby reducing the distance between nanocrystals and altering charge transfer properties in the layer. Alternatively or in addition, heating the layer can alter charge transfer properties in the layer, for example, by annealing the layer or otherwise reducing distances between nanocrystals. The heating conditions are selected to avoid decomposition of the layer or the nanocrystals. For example, the surface can be heated to a temperature of 100° C. or greater, such as 150° C. or greater, 250° C. or less, or about 200° C.

The ligand can be, for example, evaporated or sprayed onto the surface or the device can be dipped into a solution including the ligand. The ligand can be any compound capable of coordinating to or bonding with the outer surface of the nanoparticle, including, for example, hydroxide, alcohols, phosphines, thiols, amines and phosphates. In certain embodiments, the ligand includes a short hydrocarbon chain, for example, a $C_{2-6}$ alkyl, alkylene, or alkylyne chain. The chain can be optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, aryl, heteroaryl, $C_{1-4}$ alkylcarbonyloxy, $C_{1-4}$ alkyloxycarbonyl, $C_{1-4}$ alkylcarbonyl, or formyl. The hydrocarbon chain can also be optionally interrupted by O, S, N(Ra), N(Ra)—C(O)—O, O—C(O)—N(Ra), N(Ra)—C(O)—N(Rb), O—C(O)—O, P(Ra), or P(O)(Ra). Each of Ra and Rb, independently, is hydrogen, alkyl, alkenyl, alkynyl, alkoxy, hydroxylalkyl, hydroxyl, or haloalkyl. In certain embodiments, the ligand is a primary amine, for example, a $C_{2-6}$ alkyl amine such as butyl amine, or a hydroxide such as sodium hydroxide.

Alternatively, the nanocrystal can be passivated with an inorganic overcoating and subjected to thermal annealing to remove the organic ligand. For example, CdSe/ZnS core/shell nanocrystal films can be constructed, in which the magnitude of the photocurrent is larger at room temperature, and the photocurrent displays 100% internal quantum efficiency. The CdSe/ZnS nanocrystal film can be prepared by precipitation from growth solution following known methods for making optically clear close-packed films. See, e.g., Jarosz et al., *Physical Review B* 70, 195327 (2004); Leatherdale et al.,

*Physical Review B* 62, 2669 (2000); Jarosz, Ph.D. thesis, Massachusetts Institute of Technology, 2004; Kagan, Ph.D. thesis, Massachusetts Institute of Technology, 1996; Jarosz et al., *Journal of Physical Chemistry B* 107, 12585 (2003); Kagan et al., *Phys. Rev. Lett.* 76, 1517 (1996); Murray et al., *Journal of the American Chemical Society* 115, 8706 (1993); Murray et al., *Science* 270, 1335 (1995); Murray et al., *Annual Review of Materials Science* 30, 545 (2000); each of which is incorporated by reference in its entirety. For thermal annealing and removal of the ligands, CdSe/ZnS nanocrystal films can be deposited in air and heated at high temperature, preferably at a temperature between 200° C. and 350° C., and more preferably at a temperature between 250° C. and 300° C. Thermal annealing can take place under reduced pressure, for example, at a pressure of less than 10 Torr, less than 5 Torr, less than 1 Torr, less than 100 mTorr, less than 50 mTorr, or about 12 mTorr. Thermal annealing can be executed for less than 1 hour, less than 45 minutes, less than 30 minutes, or greater than 10 minutes. In addition, treatments other than heat, such as chemical ligand removal or substitution, or combinations thereof, can be used to remove the organic ligands. For example, the ligands can be removed through chemical cap exchange followed by mild heating. For example, butylamine treated CdSe/ZnS nanocrystal films can be soaked in methanol for 5 min and heated at 100° C. for 1 hr to remove the butylamine ligands.

Semiconductor nanocrystals can advantageously be used as a conductance-altering material. The semiconductor nanocrystals can have a broad absorption band with an intense, narrow band emission. The absorbance wavelength of emission can be tuned from throughout the visible and infrared regions, depending on the size, shape, composition, and structural configuration of the nanocrystals. The nanocrystals can be prepared with an outer surface having desired chemical characteristics (such as a desired solubility). Light emission by nanocrystals can be stable for long periods of time.

When a nanocrystal achieves an excited state (or in other words, an exciton is located on the nanocrystal), emission can occur at an emission wavelength. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue, or to higher energies, as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) for nanocrystals that emit in the visible can be observed. IR-emitting nanocrystals can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of nanocrystal diameters decreases. Semiconductor nanocrystals can have high emission quantum efficiencies such as greater than 10%, 20%, 30%, 40%, 50%, 60%, 70%, or 80%.

The semiconductor forming the nanocrystals can include a Group II-VI compound, a Group II-V compound, a Group III-VI compound, a Group III-V compound, a Group IV-VI compound, a Group I-III-VI compound, a Group II-IV-VI compound, or a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof.

Methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. Nos. 6,322,901 and 6,576,291, and U.S. Patent Application No. 60/550,314, each of which is incorporated by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide ((TMS)$_2$Se), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ((TMS)$_2$Te), bis(trimethylsilyl)sulfide ((TMS)$_2$S), a trialkyl phosphine sulfide such as (tri-n-octylphosphine) sulfide (TOPS), an ammonium salt such as an ammonium halide (e.g., NH$_4$Cl), tris(trimethylsilyl) phosphide ((TMS)$_3$P), tris(trimethylsilyl) arsenide ((TMS)$_3$As), or tris(trimethylsilyl)

antimonide ((TMS)₃Sb). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. By stopping growth at a particular nanocrystal average diameter and choosing the proper composition of the semiconducting material, the emission spectra of the nanocrystals can be tuned continuously over the wavelength range of 300 nm to 5 microns, or from 400 nm to 800 nm for CdSe and CdTe. The nanocrystal has a diameter of less than 150 Å. A population of nanocrystals has average diameters in the range of 15 Å to 125 Å.

The nanocrystal can be a member of a population of nanocrystals having a narrow size distribution. The nanocrystal can be a sphere, rod, disk, or other shape. The nanocrystal can include a core of a semiconductor material. The nanocrystal can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The nanocrystal can be a single composition. In certain circumstances, the nanocrystal can have an overcoating on the surface of a core. The overcoating can be a semiconductor material having a composition different from the composition of the core. The overcoat of a semiconductor material on a surface of the nanocrystal can include a Group II-VI compound, a Group II-V compound, a Group III-VI compound, a Group III-V compound, a Group IV-VI compound, a Group I-III-VI compound, a Group II-IV-VI compound, and a Group II-IV-V compound, for example, ZnO, ZnS, ZnSe, ZnTe, CdO, CdS, CdSe, CdTe, MgO, MgS, MgSe, MgTe, HgO, HgS, HgSe, HgTe, AlN, AlP, AlAs, AlSb, GaN, GaP, GaAs, GaSb, InN, InP, InAs, InSb, TlN, TlP, TlAs, TlSb, TlSb, PbS, PbSe, PbTe, or mixtures thereof. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

The particle size distribution can be further refined by size selective precipitation with a poor solvent for the nanocrystals, such as methanol/butanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include compounds derived from the coordinating solvent used during the growth process. The surface can be modified by repeated exposure to an excess of a competing coordinating group. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium. Such affinity improves the stability of the suspension and discourages flocculation of the nanocrystal. Nanocrystal coordinating compounds are described, for example, in U.S. Pat. No. 6,251,303, which is incorporated by reference in its entirety.

More specifically, the coordinating ligand can have the formula:

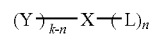

wherein k is 2, 3 or 5, and n is 1, 2, 3, 4 or 5 such that k n is not less than zero; X is O, S, S=O, SO2, Se, Se=O, N, N=O, P, P=O, As, or As=O; each of Y and L, independently, is aryl, heteroaryl, or a straight or branched C2 12 hydrocarbon chain optionally containing at least one double bond, at least one triple bond, or at least one double bond and one triple bond. The hydrocarbon chain can be optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, aryl, heteroaryl, $C_{1-4}$ alkylcarbonyloxy, $C_{1-4}$ alkyloxycarbonyl, $C_{1-4}$ alkylcarbonyl, or formyl. The hydrocarbon chain can also be optionally interrupted by O, S, N(Ra), N(Ra)—C(O)—O, O—C(O)—N(Ra), N(Ra)—C(O)—N(Rb), O—C(O)—O, P(Ra), or P(O)(Ra). Each of Ra and Rb, independently, is hydrogen, alkyl, alkenyl, alkynyl, alkoxy, hydroxylalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, or phenanthryl.

A suitable coordinating ligand can be purchased commercially or prepared by ordinary synthetic organic techniques, for example, as described in J. March, Advanced Organic Chemistry, which is incorporated by reference in its entirety.

Transmission electron microscopy (TEM) can provide information about the size, shape, and distribution of the nanocrystal population. Powder X-ray diffraction (XRD) patterns can provide the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from X-ray diffraction data using, for example, the Scherrer equation. It also can be estimated from the UV/Vis absorption spectrum.

Individual devices can be formed at multiple locations on a single substrate to form a display. The display can include devices that emit at different wavelengths. By patterning the substrate with arrays of different color-emitting materials, a display including pixels of different colors can be formed. In some applications, the substrate can include a backplane. The backplane includes active or passive electronics for controlling or switching power to individual pixels. Include a backplane can be useful for applications such as displays, sensors, or imagers. In particular, the backplane can be configured as an active matrix, passive matrix, fixed format, directly drive, or hybrid. The display can be configured for still images, moving images, or lighting. A lighting display can provide white light, monochrome light, or color-tunable light. See, e.g., U.S. patent application Ser. No. 11/253,612, filed Oct. 21, 2005, which is incorporated by reference in its entirety.

The device can be made in a controlled (oxygen-free and moisture-free) environment, preventing the quenching of luminescent efficiency during the fabrication process. Other multilayer structures may be used to improve the device performance (see, for example, The performance of light emitting devices can be improved by increasing their efficiency, narrowing or broadening their emission spectra, or polarizing their emission. See, for example, Bulovic et al., *Semiconductors and Semimetals* 64:255 (2000), Adachi et al., *Appl. Phys. Lett.* 78:1622 (2001), Yamasaki et al., *Appl. Phys. Lett.* 76:1243 (2000), Dirr et al., *Jpn. J. Appl. Phys.* 37:1457 (1998), and D'Andrade et al., *MRS Fall Meeting*, BB6.2 (2001), each of which is incorporated herein by reference in its entirety. Nanocrystals can be included in efficient hybrid organic/inorganic light emitting devices.

The narrow FWHM of nanocrystals can result in saturated color emission. This can lead to efficient nanocrystal-light emitting devices even in the red and blue parts of the visible spectrum, since in nanocrystal emitting devices no photons are lost to infrared and UV emission. The broadly tunable, saturated color emission over the entire visible spectrum of a single material system is unmatched by any class of organic chromophores (see, for example, Dabbousi et al., *J. Phys. Chem.* 101:9463 (1997), which is incorporated by reference in its entirety). A monodisperse population of nanocrystals will emit light spanning a narrow range of wavelengths. A device including more than one size of nanocrystal can emit light in more than one narrow range of wavelengths. The color of emitted light perceived by a viewer can be controlled by selecting appropriate combinations of nanocrystal sizes and materials in the device. The degeneracy of the band edge energy levels of nanocrystals facilitates capture and radiative recombination of all possible excitons, whether generated by direct charge injection, energy transfer, or absorption of light.

A surface including a plurality of nanocrystals can be formed by Langmuir-Blodgett methods (see, Dabbousi et al., *Chemistry of Materials*, 1994:6, which is incorporated by reference in its entirety), evaporative methods, dip coating or spin coating. For example, nanoparticles can be arranged into thin films by spin-casting from solution. While spin-casting is possible for molecular organics, and typical for polymer organics, it limits the available organic matrix materials to those that are highly soluble in solvents such as toluene, hexanes and chloroform, which are the preferred solvents for the TOPO capped nanoparticle colloids. In order to have a large range of possible solution mixtures and film thicknesses, it is necessary to have solubility in the range of 10 mg/mL.

Exemplary devices were prepared as follows. CdTe nanocrystals with a first absorption feature at 680 nm, emission at 698 nm, and average particle diameter of 6.2±0.4 nm are synthesized by substituting a telluride for a selenide precursor in a previously published procedure for making CdSe nanocrystals. See, for example, Snee et al., *Advanced Materials* 17:1131 (2005), which is incorporated by reference in its entirety. A solution of cadmium 2,4-pentanedionate (98%), 1,2-hexadecanediol, and tri-n-octylphosphine (TOP) was degassed for 1 hour at 100° C. This solution was cooled under argon and 1.5 M tri-n-octylphosphine telluride (TOPTe) added. The mixture was then loaded into syringe and injected into a 360° C. hot solvent solution consisting of 99% tri-n-octylphosphine oxide (TOPO), hexadecylamine, and hexaphosphonic acid. The nanocrystals were grown for approximately 10 min at 260° C. and then cooled to room temperature. Hexane was added to the room temperature growth solution and the growth solution is transferred to the nitrogen atmosphere of the glovebox for storage.

5 mL of growth solution is processed via previously reported methods to make close-packed films of nanocrystals. See, for example, Kagan, Thesis, Massachusetts Institute of Technology, 1996, Leatherdale et al., *Physical Review B* 62:2669 (2000), Jarosz et al., *Journal of Physical Chemistry B* 107:12585 (2003), Jarosz et al., *Physical Review B* 70:195327 (2004), Murray et al., *Journal of the American Chemical Society* 115:8706 (1993), Murray et al., *Science* 270:1335 (1995), Murray et al., *Annual Review of Material Science* 30:545 (2000), and Kagan et al., *Physical Review Letters* 76:1517 (1996), each of which is incorporated by reference in its entirety. The main difference between other procedures and the CdTe procedure is that all processing of the CdTe nanocrystals is done air free in the glovebox. The first step was to centrifuge the sample and save the supernatant. The precipitate consisting of TOPO and other salts was discarded. The nanocrystals were next precipitated by adding methanol and spinning the solution in the centrifuge. The supernatant was discarded and the CdTe nanocrystals were dissolved in hexane and butanol. The solution was then filtered through a 0.2 μm filter. The precipitation process was repeated again using 0.1 μm filter. The CdTe nanocrystals were precipitated a third time but they are dissolved in a 9:1 hexane:octane mixture, rather than hexane and butanol, and passed through a 0.02 μm filter. This solution was drop cast onto the measurement device, a silicon inverted field effect transistor (FET).

The FETs were fabricated by lithographically patterning gold bar electrodes 200×800×0.1 μm$^3$ on 330 nm of silicon oxide. See, for example, Morgan et al., *Physical Review B* 66:075339 (2002), which is incorporated by reference in its entirety. The electrodes were spaced by 1 or 2 μm. Top and cross sectional views of the electrodes were shown in FIGS. 1*a* and 1*b*. Gold electrodes 200×800×0.1 μm$^3$ are patterned on 330 nm of silicon oxide which is grown on the Si back gate. The electrodes are spaced by 1 or 2 μm. The pads adjacent to the electrodes (a) are used for wire bonding to contact the device to the external circuit. The nanocrystal film is drop cast over the entire measurement device and is approximately 150 nm thick when measured from the SiO$_2$ layer. The FETs were attached onto a 28-pin chip carrier with silver paint and electrical contacts were made from the electrodes to the chip carrier by gold wire bonds. Devices were tested by applying high voltage to the source, drain, and gate electrodes prior to nanocrystal deposition to screen for leakage pathways between the electrodes and through the oxide. Devices with leakage greater than 0.5 pA were discarded.

The chemical treatment with butylamine involved soaking the CdTe nanocrystal film in a 0.1 M solution of butylamine in acetonitrile for 10 min. The film was rinsed with acetonitrile and then dried in the oven for 1 hr at 70° C.

Measurements were conducted as follows. All conductivity measurements were performed in a Janis VPF-100 cryostat under vacuum. Samples were loaded into the cryostat in the glovebox and are never exposed to air. Current, I, was measured and the drain-source voltage, $V_{ds}$, was sourced with a Keithley 6517 electrometer. Gate voltage, $V_g$, was supplied with an Agilent 6614C DC power supply. A schematic of the electronic setup is shown in FIG. 1. An Ar+ laser at 514 nm was used to photoexcite the samples. It has been shown previously that photocurrent was not a result of photoinjection from the electrodes. See, for example, Leatherdale et al., *Physical Review B* 62:2669 (2000), which is incorporated by reference in its entirety. The temperature was monitored with a Lakeshore 330 temperature controller. Photocurrent decay measurements were performed by modulating the excitation light with an acousto-optic modulator and monitoring the current with a Keithley 428 current amplifier and Tektronix TDS 7154 oscilloscope.

The differential conductance measurements were carried out by applying a constant $V_{ds}$ with the Agilent 6614C DC power supply. A small AC voltage was added to the drain electrode by a function generator. The resulting AC current was sent to a current amplifier (Ithaco 1211), then to a lock-in amplifier (Princeton Applied Research 5301A), and finally read from a digital multimeter (Hewlett Packard 34401A). $V_g$ was stepped with a Keithley 2400 sourcemeter.

Figure 2:
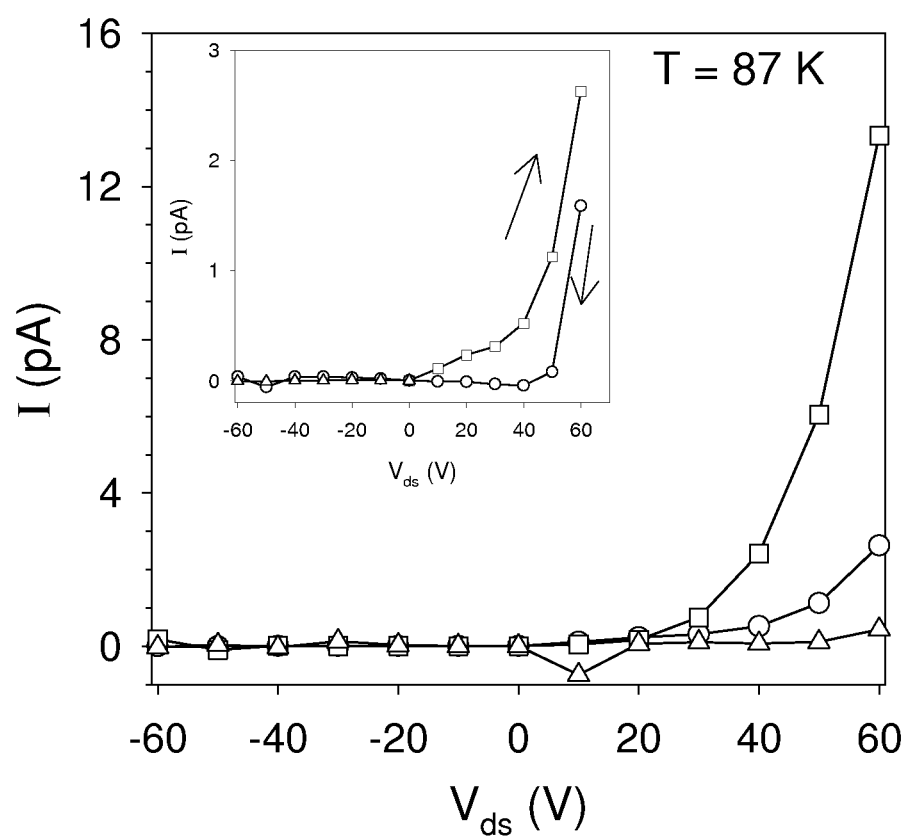
FIG. 2 is a graph depicting dark current as a function of drain bias for a nanocrystal-based field effect transistor.

FIG. 2 shows the dark current, I, at 87 K as a function of drain bias with $V_g=0$ (open circles), $V_g=-40$ V (open squares), and $V_g=+40$ V (open triangles). The inset is the full I-V curve with $V_g=0$ V and it displays the hysteresis present at low temperature. The current is swept from 0 V to +60 V (open squares), from +60 V to −60 V (open circles), and finally from −60 V to 0 V (open triangles) and it is higher on the sweep from 0 to +60 V than when the sweep is reversed. The solid lines serve as guides to the eye. The inset displays the complete I-V curve for the sample with the gate grounded. For the latter, $V_{ds}$ was swept from 0 V to +60 V (open squares), from +60 V to −60 V (open circles), and finally from −60 V back to 0 V (open triangles). The current was hysteretic with more current on the sweep from 0 V to +60 V than on the way down from +60 V to −60 V. Thus, the current apparently decays with time at these low temperatures; data points were taken every 10 seconds, giving a time scale to the hysteresis. For the I-V curves in the main part of FIG. 2 the data shown are for the voltage sweep from 0 V to +60 V and the sweep from 0 V to −60V in order to display the current before it decays.

Figure 3:
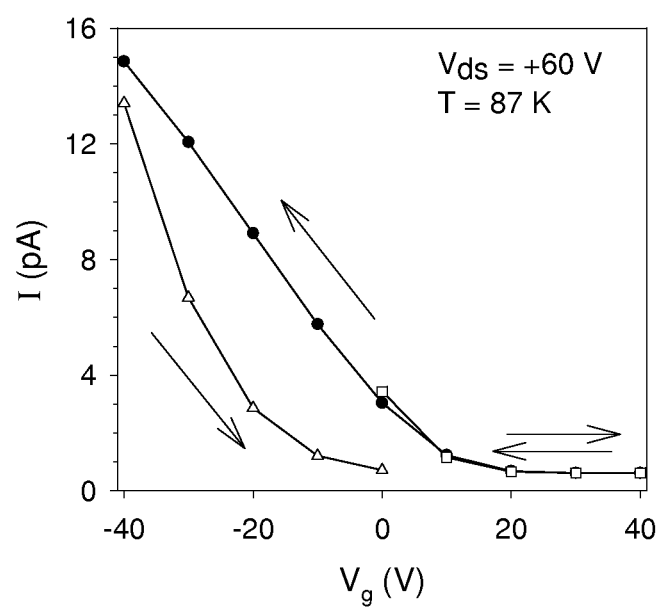
FIG. 3 is a graph depicting dark current as a function of applied gate voltage for a nanocrystal-based field effect transistor.

FIG. 3 shows the dark current, I, at 87 K as a function of applied gate voltage with $V_{ds}=+60$ V. $V_g$ is swept from 0 V to +40 V (open squares), from +40 V to −40 V (filled circles), and finally from −40 V to 0 V (open triangles). The solid lines are guides to the eye. Consistent with the data in FIG. 2, the current was largest at negative $V_g$ and suppressed at positive $V_g$. The current was roughly linear with $V_g$ when it is varied from 0 V to −40 V, but was smaller in magnitude on the way back from −40 V to 0 V.

Figure 4:
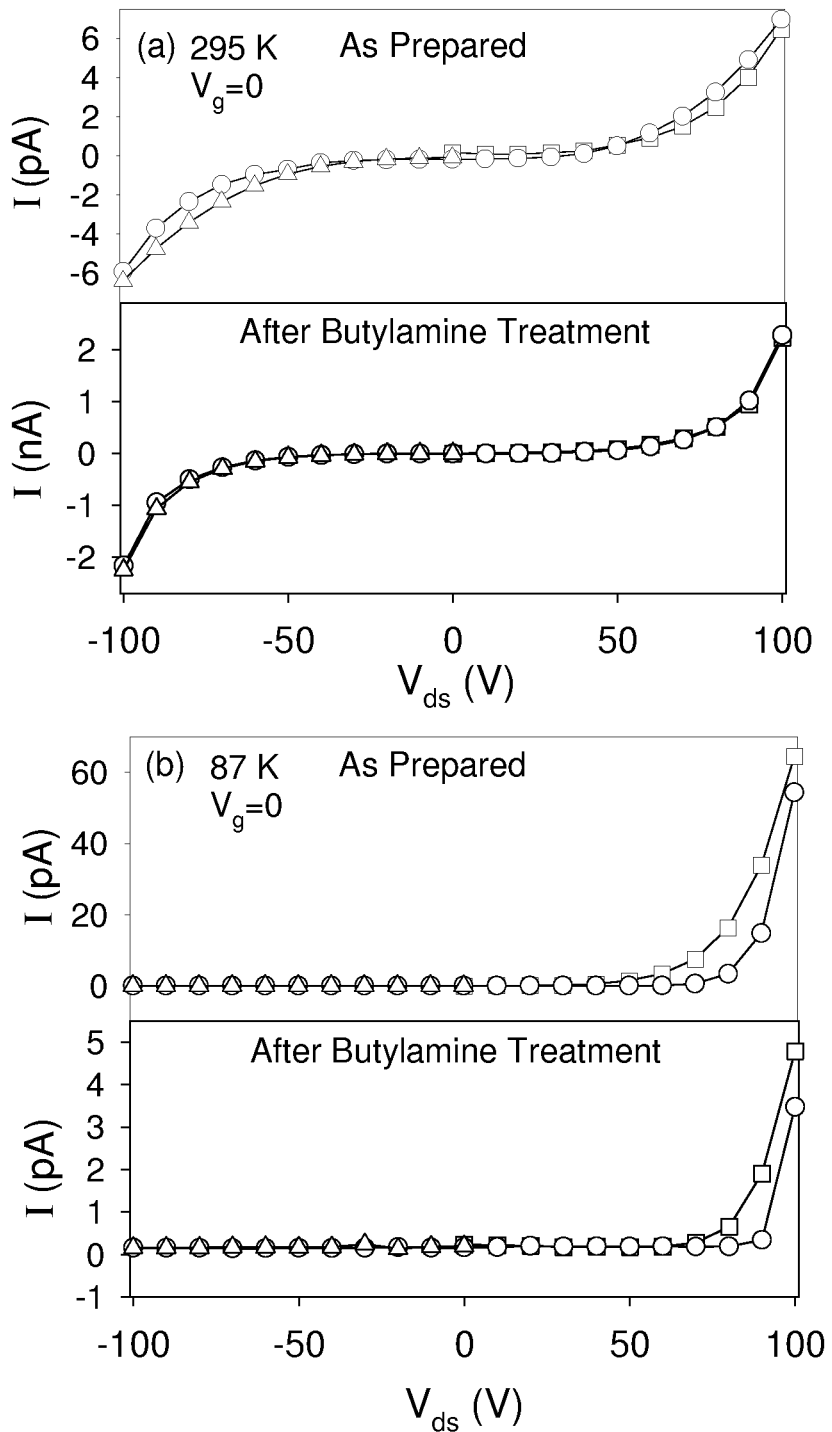
FIG. 4 are graphs depicting dark current of a nanocrystal-based field effect transistor before and after treatment with butylamine.

FIG. 4 shows the I-V curves for the dark current, I, before (top panels) and after (bottom panels) treatment with butylamine at (a) 295 K and (b) 87 K with $V_g=0$. $V_{ds}$ is swept from 0 V to +100 V (open squares), from +100 V to −100 V (open circles), and finally from −100 V to 0 V (open triangles). Solid lines serve as guides to the eye. Note that the current at 295K increases by almost 1000 times after treatment. In all four plots of FIG. 4 $V_{ds}$ was swept from 0 V to +100 V (open squares), +100 V to −100 V (open circles), and finally from −100 V back to 0 V (open triangles). Note the different scales in the two panels of FIG. 4(*a*): The dark current at 295 K was approximately three orders of magnitude higher after treatment with butylamine. By contrast, at 87 K (FIG. 4(*b*)), the dark current decreases rather than increases with butylamine treatment. Whereas the current was hysteretic and measurable only for positive $V_g$ at 87 K, it showed little hysteresis and is nearly symmetric with $V_{ds}$ at 295 K.

Figure 5:
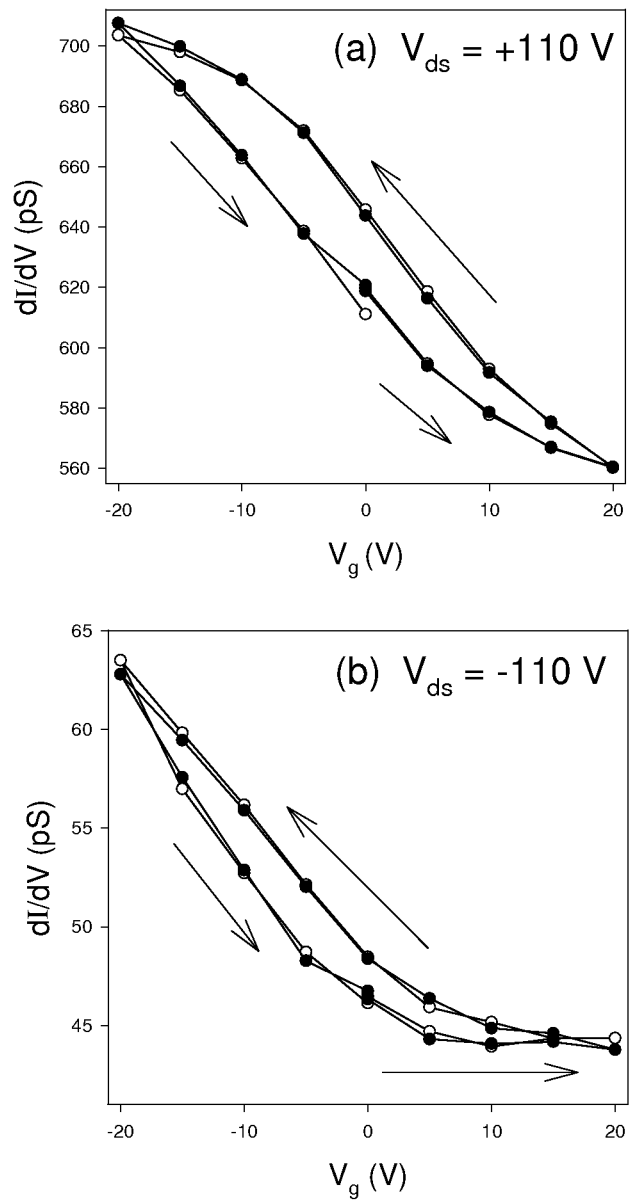
FIG. 5 are graphs depicting differential conductance of a nanocrystal-based field effect transistor.

Differential conductance measurements at room temperature as a function of gate voltage are displayed in FIG. 5 for a sample treated with butylamine. Specifically, FIG. 5 shows (a) Differential conductance, dI/dV, as a function of $V_g$ with (a) $V_{ds}=+110$ V and (b) $V_{ds}=-110$ V. $V_g$ is applied for 5 s followed by a recovery period of 5 sec at each value of $V_g$. $V_g$ is varied from 0 V to +20 V, from +20 V to −20 V, and finally from −20 V to 0 V. $V_{ac}$ is 2 $V_{rms}$ at a frequency of 13 Hz. In (a) and (b) the open circles are the first $V_g$ cycle and the closed circles are the second cycle. To measure the differential conductance, a small AC voltage of 2 $V_{rms}$ at 13 Hz was applied in series with a DC voltage of $|V_{ds}|=10$ V across the electrodes (the electrodes are spaced by 2 μm for the data in FIG. 5). The gate voltage was stepped in increments of 5 V. To minimize the hysteresis, $V_g$ was applied for 5 seconds and return $V_g$ to zero for 5 sec for each data point. This effectively was a measurement of how the slope of the I-$V_{ds}$ curve at $|V_{ds}|=10$ V varies with gate voltage. For both positive and negative $V_{ds}$ the differential conductance increased with increasing negative $V_g$ and decreases with positive $V_g$.

Figure 6:
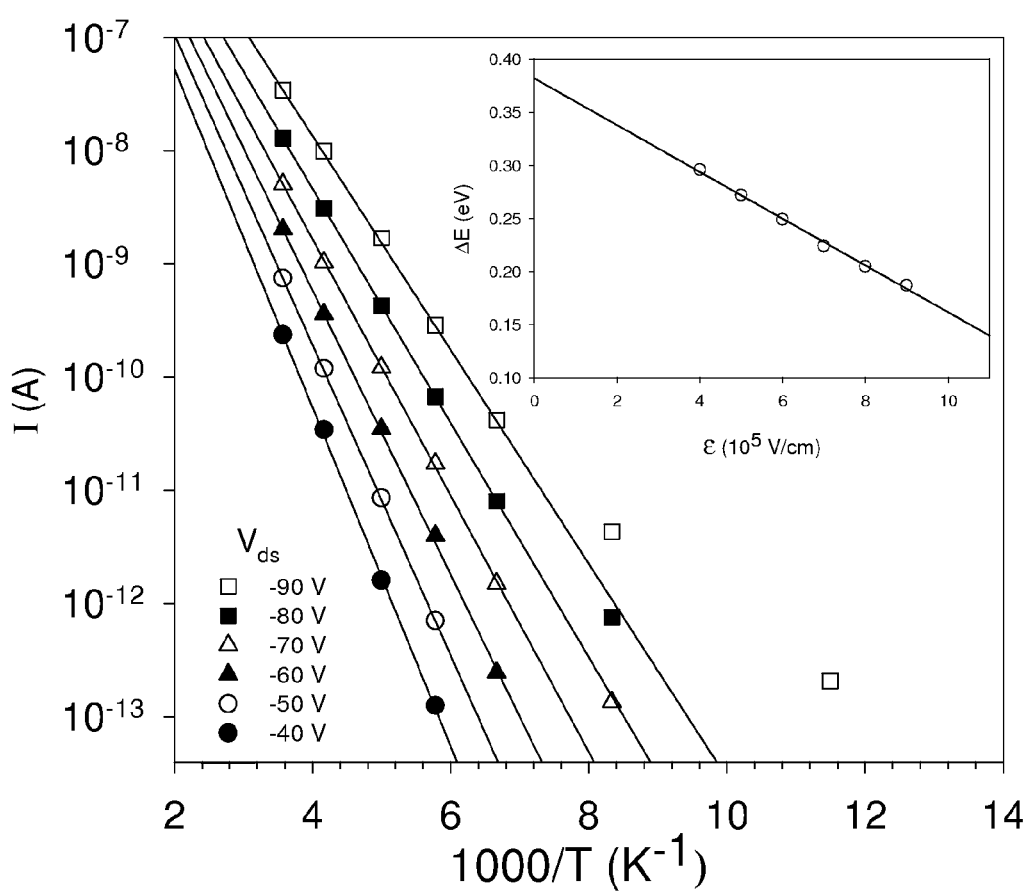
FIG. 6 is a graph depicting temperature dependence of dark current of a nanocrystal-based field effect transistor.

The temperature, T, dependence of the dark current at $V_{ds}=-90, -80, -70, -60, -50$, and $-40$ V for a butylamine treated sample is plotted in FIG. 6. Specifically, FIG. 6 represents the temperature dependence of the dark current, I, (butylamine treated) at various values of $V_{ds}$ with $V_g=0$. The solid lines are Arrhenius fits to the data at each voltage. The inset is a plot of the activation energy, ΔE, as a function of field, $\in=V_{ds}/L$, where L is the electrode separation. The solid line in the inset is linear fit to the activation energy versus field data. The dark current was linear with inverse temperature when plotted on a semi-logarithmic graph, indicating Arrhenius behavior. Solid lines were fits to the Arrhenius equation at each voltage. The current noise of the electrometer was ~0.01 pA, indicating that except at the most negative voltages, there was no evidence for anything other than a simply activated current. From the fits the activation energy at each voltage was determined, and the activation energy was plotted versus electric field in the inset of FIG. 6 and fit to a straight line. The y-intercept of the line gave the zero-field activation energy for the dark current and was found to be 0.38±0.02 eV. From the slope of the line the distance traveled during the rate-limiting step in the activated process can be calculated:

$$\Delta E = el\in, \quad (1)$$

where ΔE is the activation energy, e is the charge of the electron, l is distance, and $\in$ is electric field. From the fit of the inset of FIG. 6, it was possible to determine that l=2.2±0.2 nm. Notably, before butylamine treatment, the conductance was too small to measure the T dependence.

Figure 7:
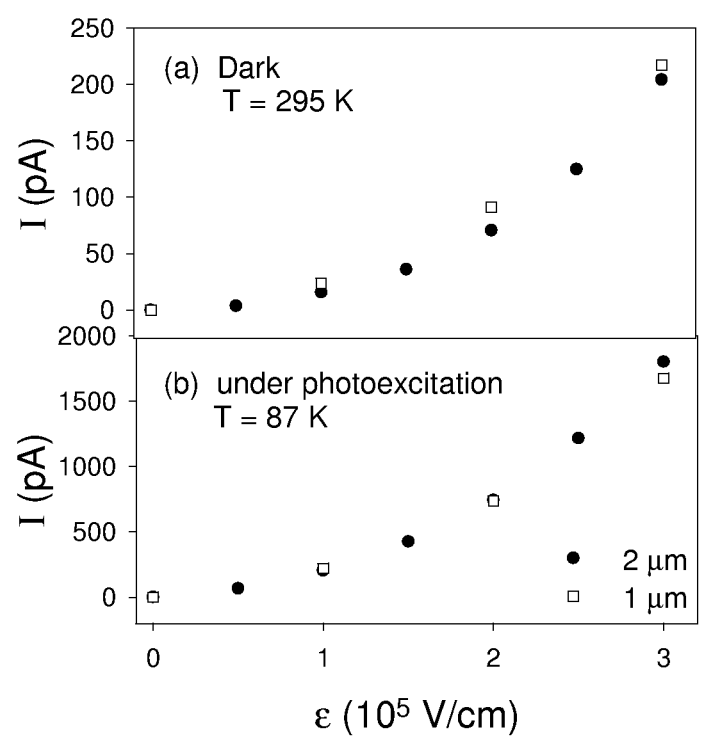
FIG. 7 are graphs depicting dark current and photocurrent of a nanocrystal-based field effect transistor.

FIG. 7 demonstrates that both the room temperature dark current, I, and the low temperature photocurrent, $\Delta I$, depend only on electric field, and not independently on the separation of the electrodes. Specifically, FIG. 7 shows (a) dark current, I, at 295 K and (b) photocurrent, $\Delta I$, at 87 K and $V_g=0$ measured on a 1 μm gap (open squares) and on a 2 μm gap (closed circles) and plotted versus electric field, $\in = V_{ds}/L$, where L is the gap between the electrodes. Here, $\Delta I$ was the difference between the dark and photocurrents, since the dark current is in general 2-3 orders of magnitude less than the photocurrent, $\Delta I$ and the absolute photocurrent are essentially identical. The current was measured across electrodes with gaps of 1 μm and 2 μm and was found to be the same magnitude for a given field. The sample used for FIG. 7 was deposited onto gold electrodes patterned on a quartz substrate and has no back gate. This was done in order to minimize field drop to the gate and better observe the field scaling effect.

Figure 8:
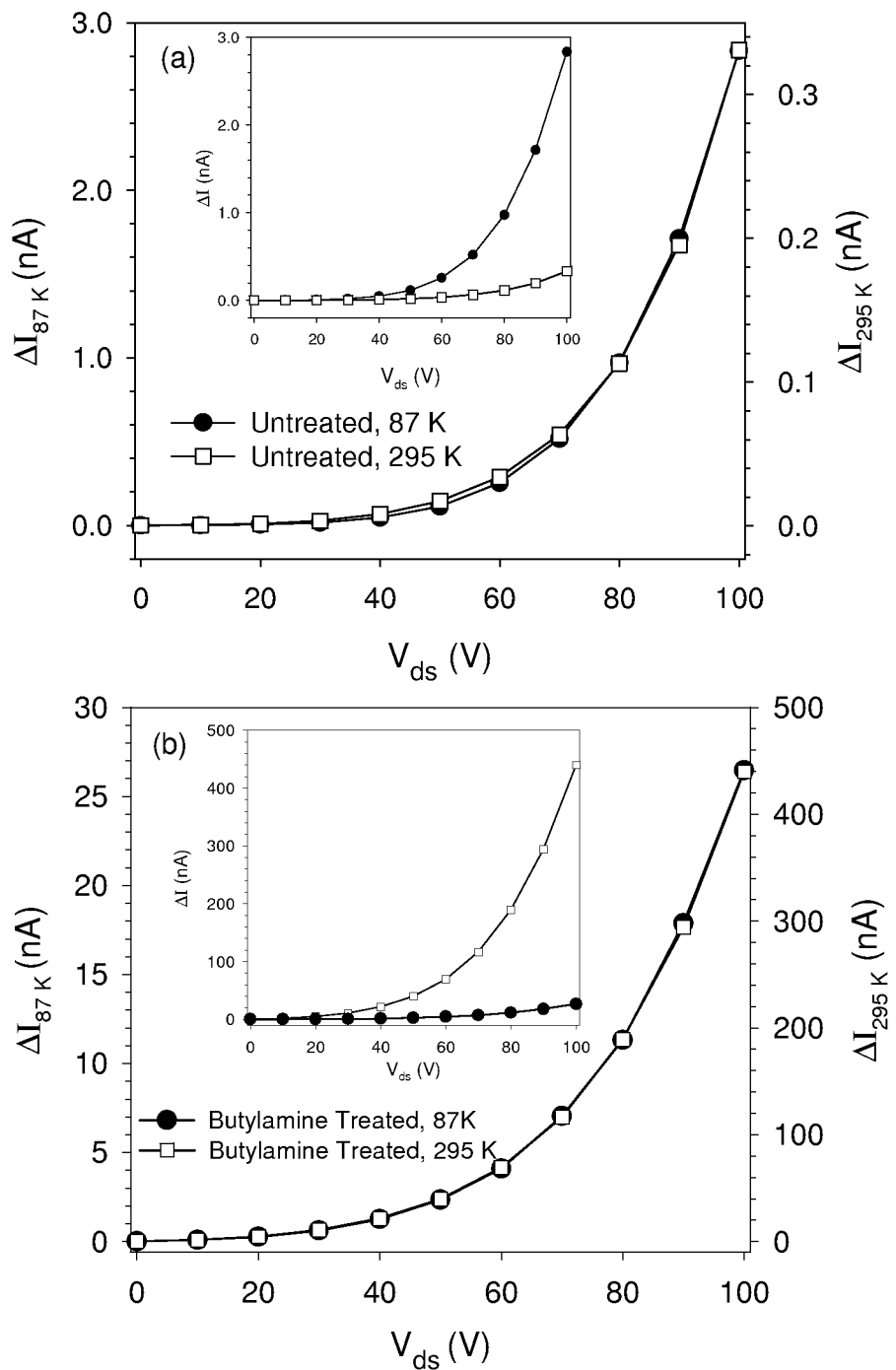
FIG. 8 are graphs depicting photocurrent of a nanocrystal-based field effect transistor at 87 K and 295K.

The photocurrents, $\Delta I$, vs. $V_{ds}$ at 87 K and 295 K were given in FIG. 8 for both untreated (a) and butylamine-treated (b) films. In particular, FIG. 8 shows (a) photocurrent, $\Delta I$, at 87 K (filled circles and left axis) and at 295 K (open squares and right axis) before treatment with butylamine ($V_g=0$). Each axis is scaled to illustrate the similar shape of the $\Delta I$-V curves at the two temperatures. The inset in (a) is the data plotted with a shared y-axis to illustrate the difference in the magnitude of the current at the two temperatures. Also, FIG. 8 shows (b) photocurrent at 87 K (filled circles and left axis) and at 295 K (open squares and right axis) after treatment with butylamine ($V_g=0$). The inset in (b) is the data plotted with a shared y-axis. Solid lines are guides to the eye. The photoexcitation intensity is 30 mW/cm². The axis for the photocurrent at each temperature is scaled to show that the shape of the two I-V curves is the same. The intensity of the excitation light was 30 mW/cm². The insets were included to emphasize how the magnitude of the photocurrent varies with T. The magnitude of the photocurrent increased with treatment at both temperatures. However, as seen in the insets, the temperature dependence after treatment was opposite to that before treatment: the magnitude of the photocurrent before treatment increases as T decreases, whereas after treatment it decreases with T. For all data in FIG. 8 $V_{ds}$ was swept from 0 V to +100 V. Though not shown, $\Delta I$ in all plots was symmetric in $V_{ds}$ and displayed little hysteresis.

Figure 9:
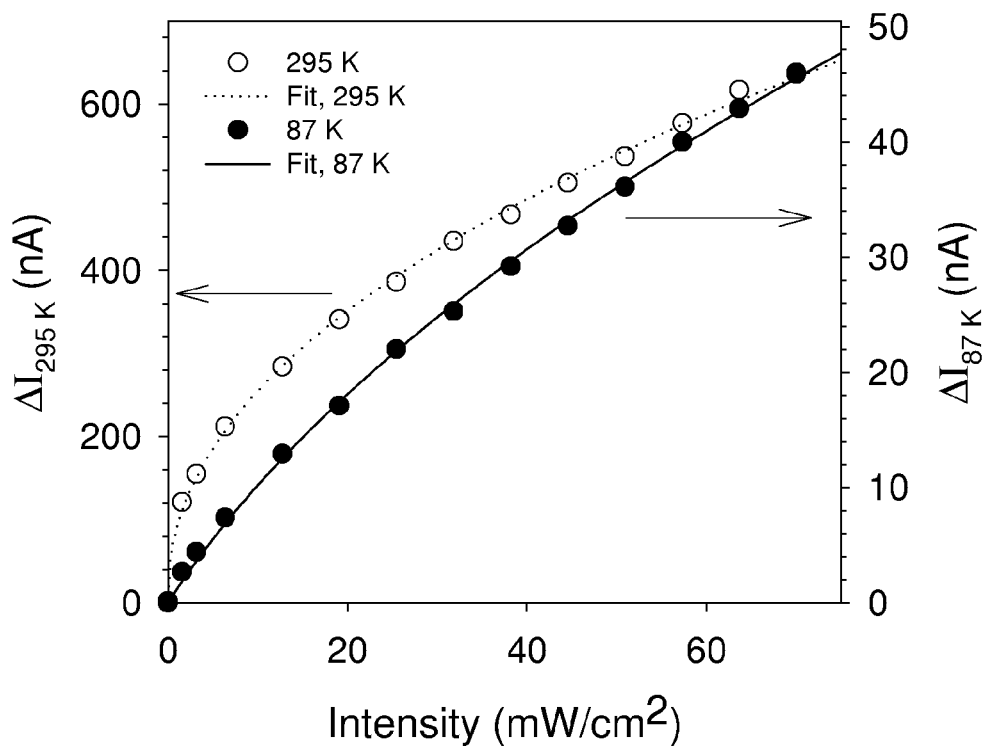
FIG. 9 is a graph depicting photoexcitation intensity dependency of a nanocrystal-based field effect transistor.

FIG. 9 shows the dependence of $\Delta I$ on photoexcitation intensity. $V_{ds}=+100$ V was applied to the sample while the photoexcitation intensity is stepped. Measurements were performed on the CdTe nanocrystal film after butylamine treatment at 87 K (closed circles) and 295 K (open circles). The solid line is a fit to the 87 K data, and the dotted line is a fit to the 295 K data, as discussed in the text. The sample has been treated with butylamine; $V_{ds}=+100$ V and $V_g=0$. The photoexcitation intensity dependence of the current was closer to linear at 87 K than at room temperature.

Figure 10:
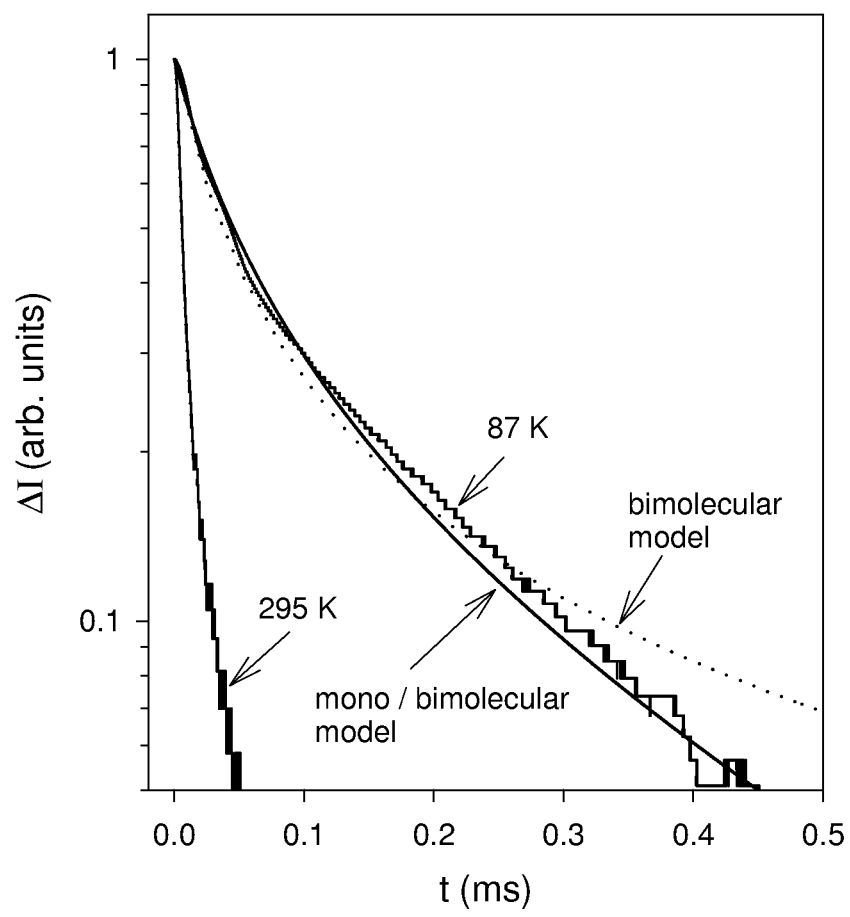
FIG. 10 is a graph depicting photocurrent of a nanocrystal-based field effect transistor.

FIG. 10 shows the decay of $\Delta I$ after the excitation light is turned off at room temperature and 87 K. Specifically, FIG. 10 shows the photocurrent, $\Delta I$, decay at 295K and 87K for a sample treated with butylamine. $V_{ds}=-90$ V, $V_g=0$, and the excitation intensity is 30 mW/cm² before the photoexcitation is removed. The curve furthest to the right is the photocurrent decay at 87 K while the curve to the left is the photocurrent decay at 295 K. The decay at 87 K is fit with a model for bimolecular recombination (dotted line) and a model for a combination of bimolecular and monomolecular recombination (solid line) as described in the text. The decay at 295K is, for the most part, faster than the resolution of the current amplifier used for the measurement. $V_{ds}$ was held at -90 V and the photoexcitation intensity of the light is 30 mW/cm². The photocurrent decay was faster at room temperature than at 87 K.

The results presented in FIGS. 2-10 depict trends which have been observed on all CdTe nanocrystal film samples measured to date. The magnitude of the current varies slightly from sample to sample due to differences in sample thickness but the I vs. $V_{ds}$ curves all display the same response to temperature, butylamine treatment, photoexcitation, and gate voltage. Three batches of CdTe nanocrystals were synthesized and 2-3 samples prepared from each batch. Eight samples were measured in total. On each sample 3 separate 1 or 2 μm gaps were tested. FIGS. 2 and 3, (which demonstrate the gate dependence of the CdTe nanocrystal film) were generated from the same sample. FIGS. 4, 8, 9, and 10 show the behavior of the dark and photocurrent after chemical treatment and were generated from the same sample. FIGS. 5, 6, and 7 were measured at a later time and each show data taken from separate samples.

Previous studies of charge transport in close-packed CdSe nanocrystal films, performed on inverted FET structures, found that current resulting from the injection of electrons was on the order of picoamps at $V_{ds} \sim 100$ V and decayed with time after application of the voltage. The number of electrons injected was affected by the gate but this current also decayed over time. See, for example, Drndic et al., *Journal of Applied Physics* 92:7498 (2002) and Morgan et al., *Physical Review B* 66:075339 (2002), each of which is incorporated by reference in its entirety. Even after treatment with basic molecules, which were shown to decrease the interdot spacing, no steady-state dark current was observed in the CdSe nanocrystal films. See, for example, Jarosz et al., *Physical Review B* 70:195327 (2004), each of which is incorporated by reference in its entirety. At low temperature CdTe nanocrystal films, like CdSe nanocrystal films, display transient dark current on the order of picoamps. However, unlike CdSe nanocrystal films the room temperature dark current in CdTe nanocrystal films is steady-state.

Charge transport in close-packed nanocrystal films can be limited by tunneling between dots and to therefore have a strong dependence on the inter-dot spacing. See, for example, Kagan, Thesis, Massachusetts Institute of Technology, 1996, Leatherdale et al., *Physical Review B* 62, 2669 (2000), and Jarosz et al., *Physical Review B* 70, 195327 (2004), each of which is incorporated by reference in its entirety. Treatment with butylamine (dried at 70° C. for one hour) has been shown to enhance photoconductivity in CdSe nanocrystal films by decreasing interparticle spacing from about 1.1 nm before treatment to about 0.2 nm after treatment. See, for example, Jarosz et al., *Physical Review B* 70, 195327 (2004) which is incorporated by reference in its entirety. Treatment with sodium hydroxide can enhance photoconductivity in CdSe nanocrystal films by decreasing interparticle spacing from about 1.1 nm before treatment to about 0.06 nm after treatment. Table 1 lists the interparticle spacing in CdSe nanocrystal films as a function of chemical treatment from Atomic Force Microscopy (AFM) and Glancing Incidence Small Angle X-ray Scattering (GISAXS) measurements for the reference and treated samples. The spacing in the reference sample was determined via Transmission Electron Microscopy to be 1.1 nm±0.3 nm. The samples were treated by immersion in a 0.1 M solution of the selected ligand: butylamine; aniline; 1,6-diaminohexane; 1,4-phenylenediamine; tri-n-butylphosphine; or sodium hydroxide. The solvent for each solution was anhydrous acetonitrile, except for sodium hydroxide which was dissolved in anhydrous methanol due to its limited solubility in acetonitrile. Each sample was soaked for 10 minutes, rinsed with 1 mL of solvent, and dried in an oven at 70° C. for one hour. In addition, one butylamine-treated sample was dried overnight in the glovebox instead of oven drying.

TABLE 1

| Chemical Treatment | Chemical Structure | Interparticle Spacing (Å) AFM | Interparticle Spacing (Å ± 0.3 Å) GISAXS |
|---|---|---|---|
| Reference | 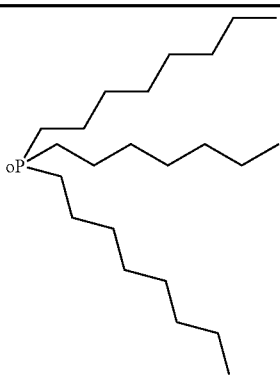 | — | 11.0 |
| 1,4-phenylenediamine | H₂N—⟨⟩—NH₂ | 5-7 | 7.5 |
| Aniline | ⟨⟩—NH₂ | 5-7 | 6.8 |
| Tri-n-butylphosphine | 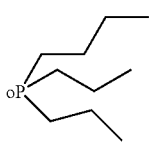 | 7 | 6.8 |
| Butylamine (dried overnight) | No oven, H₂N~~ | 5-7 | 4.6 |
| 1,6-diaminohexane | H₂N~~~~NH₂ | 3-5 | 4.1 |
| Butylamine (oven-dried) | Oven, H₂N~~ | — | 1.9 |
| Sodium Hydroxide | Na⁺OH⁻ | — | 0.6 |

In addition to interparticle spacing, the functionality of the ligand can also affect the photoconductivity of the nanocrystal film. For example, amine functionality can passivate the surface of the nanocrystal which results in an increased photoconductivity.

Interparticle spacing can also be significantly reduced via inorganic passivation of the nanocrystal cores followed by removal of the organic ligands. GISAXS measurements show that many nanocrystals in a CdSe/ZnS core/shell nanocrystal film subjected to thermal annealing were initially about 1.25 nm apart, were about 0.25 nm apart after heating to 200° C., and were touching after heating to 300° C. The thickness and quality of the inorganic overcoating also affect the magnitude of the photocurrent.

Similarly, treatment with butylamine increases the room temperature dark conductance in CdTe nanocrystal films by more than three orders of magnitude (FIG. 4). The dark current after treatment with butylamine treatment was large enough to measure the differential conductance as a function of gate voltage. FIG. 5 shows that the differential conductance at both positive and negative $V_{ds}$ increases with increasing negative $V_g$ and decreases with positive $V_g$. The lack of no increase in differential conductance even at quite large positive $V_g$ suggests that the electrons' contribution to the current is small. This indicates that holes are the majority carriers.

The low temperature dark current is also most likely carried by holes. Dark current is only present at positive drain bias and increases with the application of a negative gate bias (FIGS. 2 and 3), consistent with hole conduction in a FET. The observed hysteresis could be a result of charge build up at the injecting contact or of the opening and closing of conducting channels between the electrodes. See, for example, Morgan et al., Physical Review B 66:075339 (2002), and Novikov et al., Physics Review B 72:075309 (2005), each of which is incorporated by reference in its entirety.

The temperature dependence of the dark current, after treatment with butylamine, suggests that the hole density is thermally activated (FIG. 6). The zero-field activation energy (from the inset of FIG. 6) is 0.38±0.02 eV. This is smaller than half of the estimated band edge energy of 1.8 eV needed to create an electron-hole pair thermally. We infer that the current is limited by the release of holes from traps. The room temperature dark current I-V curve is nearly symmetric and displays little hysteresis at room temperature (FIG. 4(a)). Since holes are the dominant carrier, the symmetric $V_{ds}$ dependence can be ascribed to the field dependence of the mobility of the holes, as well as that of their activation energy, as discussed in detail below with respect to the photoconductance.

As reported previously by Jarosz et al. (*Physical Review B* 70:195327 (2004)), the photocurrent in CdSe nanocrystal films after chemical treatment displays saturation with applied field when every photogenerated carrier reaches an electrode before recombining. The photoconductive gain was found to be equal to unity for this system, and this indicates that the gold electrodes formed blocking contact with the CdSe nanocrystal film. The current for these films was found to saturate at lower applied voltages at 87 K than at room temperature because the exciton lives longer at lower T and the probability of ionization at a given field is therefore larger. This higher ionization probability also explains why the photocurrent in CdSe nanocrystal films is larger at low T than high T.

Before treatment with butylamine, the photocurrent in CdTe nanocrystal films (FIG. 8(a)) increased with decreasing T, as well. However, after treatment the photocurrent at 295 K was higher than the photocurrent at 87 K (FIG. 8(b)). Furthermore, saturation was not observed at either temperature. At the fields used it is unlikely that the current as limited by field ionization of the exciton. In addition, the magnitude of the current was higher than expected for a photoconductive gain of unity. The photocurrent in CdTe nanocrystal films can be a secondary photocurrent rather than a primary photocurrent as observed in CdSe nanocrystal films.

Secondary photocurrents occur when the contacts can inject electrons, holes, or both. See, for example, Bube, *Photoconductivity of Solids* 1960, New York: Wiley, which is incorporated by reference in its entirety. The dark current in CdTe nanocrystal films was carried by holes, as discussed above, and these holes can be replenished from the gold electrodes to maintain a steady-state current. Assuming that both carriers can be mobile but that only the hole was replenished at the electrodes, the gain does not saturate at unity. Holes contribute to the current until the electron reaches the electrode or recombines with a hole. The lifetime of the hole was thus equal to the lifetime of the electron. At high fields the electron reaches the electrode and the lifetimes of both the electron and the hole equal the transit time of the electron.

$$\tau_p = \tau_n = T_n = \frac{L^2}{\mu_n V}, \quad (2)$$

where $\tau_p$ is the hole lifetime, $\tau_n$ is the electron lifetime, $T_n$ is the transit time of the electrons, L is the width of the gap, $\mu_n$ is the electron mobility, and V is the applied voltage. The photoconductive gain, G, becomes a function of the mobility of the two carriers:

$$G \approx \frac{\mu_p}{\mu_n} \quad (3)$$

See, for example, Bube, *Photoconductivity of Solids* 1960, New York: Wiley, which is incorporated by reference in its entirety. Therefore the gain was expected to be greater than unity if the mobility of the hole is greater than that of the electron.

Given the excitation intensity, sample area, optical absorption of the film, exciton separation efficiency (assumed to be 1) and a gain of unity, we estimate the maximum primary photocurrent expected in the CdTe nanocrystal film to be approximately 40 nA. The current at 100 V and room temperature is 440 nA, resulting in a photoconductive gain of about 10. Were the electron more mobile than the hole, as it is in bulk CdTe, the gain would be less than unity. See, for example, Landolt et al., *Numerical Data and Functional Relationships in Science and Technology*. 1961, Berlin: Springer-Verlag, which is incorporated by reference in its entirety. Thus the hole has a higher mobility than the electron in the CdTe nanocrystal film and holes effectively cycle through the circuit for a time equal to the recombination time. The concept of a hole is particular to a semiconductor and they do not actually travel in the external measurement circuit. However, the motion of holes in the film of CdTe nanocrystals influences the flow of electrons in the external circuit. A hole leaving the nanocrystal film corresponds to an electron entering the film and vice versa. At 100V, 10 holes enter and exit the film before recombining with the photogenerated electron and thus travel an effective distance of ~$10^{-3}$ cm. The recombination lifetime is faster than the resolution of our current amplifier at room temperature, giving an upper bound on the lifetime of 10 µs. From this information, a lower limit on the hole mobility of ~$10^{-4}$ cm$^2$/Vs at 100V can be established.

The photoexcitation intensity dependence of the photocurrent (FIG. 9), fit using the procedure outlined by Jarosz et al., provides information about the recombination mechanism. See, for example, Jarosz et al., *Journal of Physical Chemistry B* 107:12585 (2003), and Bube, *Photoconductivity of Solids* 1960, New York: Wiley, each of which is incorporated by reference in its entirety. Photogenerated holes, of density n, can either recombine with the equal density of photogenerated electrons or with the pre-existing trapped electrons, of density $N_t$:

$$F = (N_t + n)nb \quad (4)$$

where F is the carrier photogeneration rate, proportional to photoexcitation intensity, and b is the bimolecular recombination coefficient. In CdSe nanocrystal films it has been suggested that holes are trapped in surface states such as unpassivated selenium and electrons (the counter charge) are deeply trapped on $SeO_2$. See, for example, Jarosz et al., *Journal of Physical Chemistry B* 107:12585 (2003), which is incorporated by reference in its entirety. By analogy, CdTe nanocrystal films most likely contain holes trapped in unpassivated Te sites and trapped electrons in $TeO_2$. If $N_t$ is much larger than n the current, proportional to the hole concentration, is linear in photoexcitation intensity, while if n is larger than $N_t$ the current is proportional to the square root of the photoexcitation intensity. Fitting Eq. (4) to the data at low temperature in FIG. 9 we find $$\frac{n}{N_t} = 1.34,$$

indicating that holes recombine with both free and trapped electrons, approximately equally. At 295 K the fit is poor because $$\frac{n}{N_t}$$

is so large. When the data is instead fit to a power law, as designated by the dotted line in FIG. 9, the exponent is 0.5, as expected for bimolecular recombination.

When recombination involves both photogenerated and trapped carriers, the current decay from steady state, after light excitation is removed, is predicted to follow $$\frac{n}{n_o} = \frac{\exp(-N_t bt)}{1 + \frac{n_o b}{N_t b}(1 - \exp(-N_t bt))} \quad (5)$$

where $n_o$ is initial carrier density, and t is the time after removal of photo-excitation. See, for example, Bube, *Photoconductivity of Solids* 1960, New York: Wiley, which is incorporated by reference in its entirety. The low temperature data in FIG. 10 can be fit with Eq. (5), as well as the bimolecular form, obtained by taking the limit of $N_t b \rightarrow 0$. Equation (5) is a better fit, confirming that recombination of holes with trapped electrons is significant at low temperatures. From the fit $\tau = (N_t b)^{-1} = 340$ μs and $(n_o b)^{-1} = 55$ μs. Most of the room temperature photocurrent decay is faster than the 10 μs rise time of the current amplifier. Though the decay could not be fit with the bimolecular form of Eq. (5), an increase in the decay rate supports the concept that trapping plays a smaller role as the temperature increases.

The transient dark current in films of annealed CdSe has a voltage dependence at fixed time that is well described by the following phenomenological expression:

$$\Delta I \approx \frac{V_{ds}}{R_o} \exp\left(\frac{|V_{ds}|}{V_o}\right) \quad (6)$$

Figure 11:
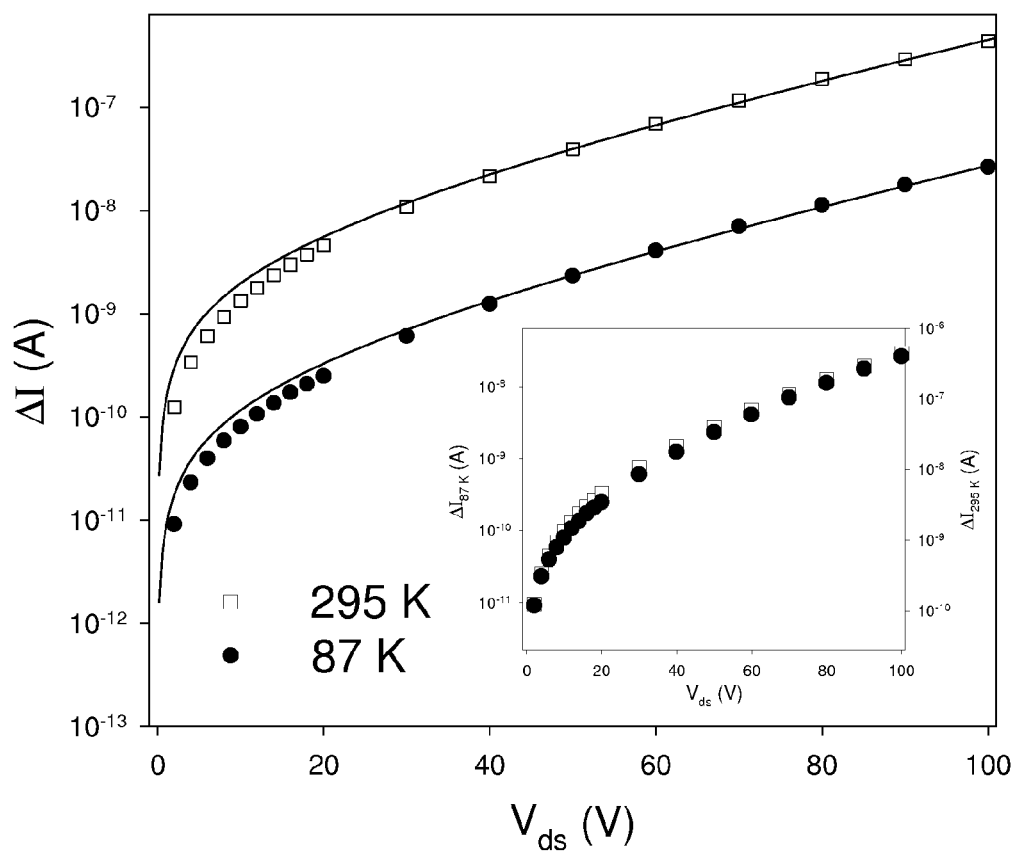
FIG. 11 are graphs depicting a semi-logarithmic plot of photocurrent of a nanocrystal-based field effect transistor.

See, for example, Drndic et al., *Journal of Applied Physics* 92, 7498 (2002), which is incorporated by reference in its entirety. Here $R_o$ is a characteristic resistance and $V_o$ is a characteristic voltage. FIG. 11 is a semi-logarithmic plot of the photocurrent, $\Delta I$, versus $V_{ds}$ with $V_g=0$ at 295 K (open circles) and 87 K (closed circles). The solid lines are fits to Eq. (6), ith good agreement with $V_o=29$ V for both 87 K and 295 K. The data are scaled in the inset to show that the field dependence is independent of temperature. This corresponds to an energy difference from one nanocrystal to its neighbor of ~175 meV (determined by dividing $V_o$ by the number of nanocrystals which fit across 1 μm), similar to the value found in annealed CdSe nanocrystal films. See, for example, Drndic et al., *Journal of Applied Physics* 92:7498 (2002), which is incorporated by reference in its entirety. $R_o$ at 87 K is $1.2*10^{11}$ Ω and $R_o$ at 295 K is $7.2*10^9$ Ω. The temperature dependence of $R_o$ is consistent with the increased importance of monomolecular recombination at low T. The observation that this simple phenomenological model describes the voltage dependence of the photocurrent so well, with the same value of $V_o$ at low and high T is very important. As discussed above, the fields are high enough that all excitons are ionized. Therefore, the voltage dependence of Eq. (6) comes from that of the mobility, and the field dependence of the mobility of the holes is well described by $$\mu \propto \exp\left(\frac{|\varepsilon|}{\varepsilon_o}\right) \quad (7)$$

where $\varepsilon_o$ is a characteristic electric field. However, as in the case of CdSe nanocrystal films, the field scale $\varepsilon_o$ is too small to be explained by a simple tunneling model. See, for example, Drndic et al., *Journal of Applied Physics* 92:7498 (2002), which is incorporated by reference in its entirety.

Figure 12:
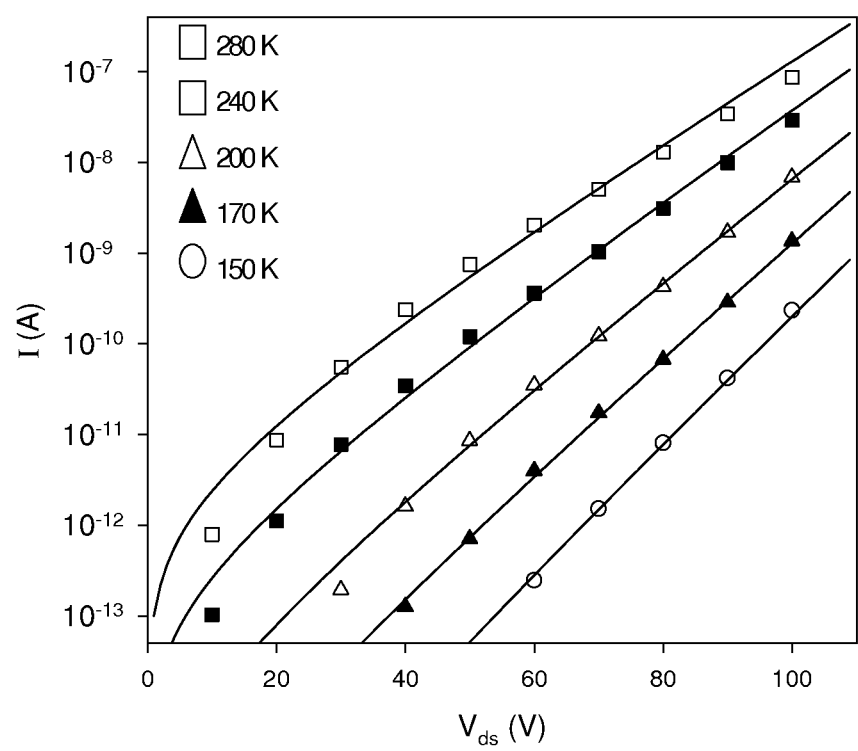
FIG. 12 is a graph depicting dark current of a nanocrystal-based field effect transistor at various temperatures.

The steady-state dark current can be described in the same way: As discussed above, the holes are thermally released from traps with an activation energy that decreases linearly with voltage (see FIG. 6). Assuming that the holes, once released from traps have the field-dependent mobility described by Eq. (7) the dark current can be predicted to be $$I = \frac{V_{ds}}{R_o} \exp\left(\frac{V_{ds}}{V_o} + \frac{aV_{ds} - \Delta E_0}{kT}\right) \quad (8)$$

where $\Delta E_0$ is the zero-field activation energy, k is Boltzmann's constant, and a=1/L (see Eq. (1)). In FIG. 12, which is a graph of dark current, I, versus $V_{ds}$ at various temperatures with $V_g=0$ in which the solid lines, this form can be fit the I-$V_{ds}$ curves at each temperature. By setting $V_o=29$ eV from the photocurrent data and then fitting the data at 150 K and 280 K to Eq. (8), it is possible to adjust $R_o$, and $\Delta E_0$, until both data sets are fit by varying only the temperature. For the best fit $R_o=5 \cdot 10^6$ Ω, $a=1.5 \cdot 10^{-3}$, and $\Delta E_0=0.34 \pm 0.02$ eV. $\Delta E_0$ is close to the value $0.38 \pm 0.02$ eV value determined from the inset of FIG. 5. $R_o$, a, $\Delta E_0$, and $V_o$ are all held constant in the fits at 240, 200, and 170 K. The agreement of this phenomenological expression with the data is remarkable.

The studies of the transport properties of CdTe nanocrystal films in FET structures lead to the following conclusions which are generally true for CdTe nanocrystal films contacting gold electrodes: (1) the current is carried by holes, both in the dark and under photoexcitation; (2) the secondary photocurrent measured in the CdTe nanocrystal films, made possible by the non-blocking gold electrodes, gives a gain greater than unity, showing that holes have a higher mobility than electrons; (3) the voltage dependence of the photocurrent is temperature independent and leads to a simple phenomenological description of the voltage dependence of the hole mobility; and (4) the dark current is thermally activated with an energy that decreases linearly with voltage. The voltage dependence of the mobility, extracted from the photocurrent, is the same as that of the dark current.

Figure 13:
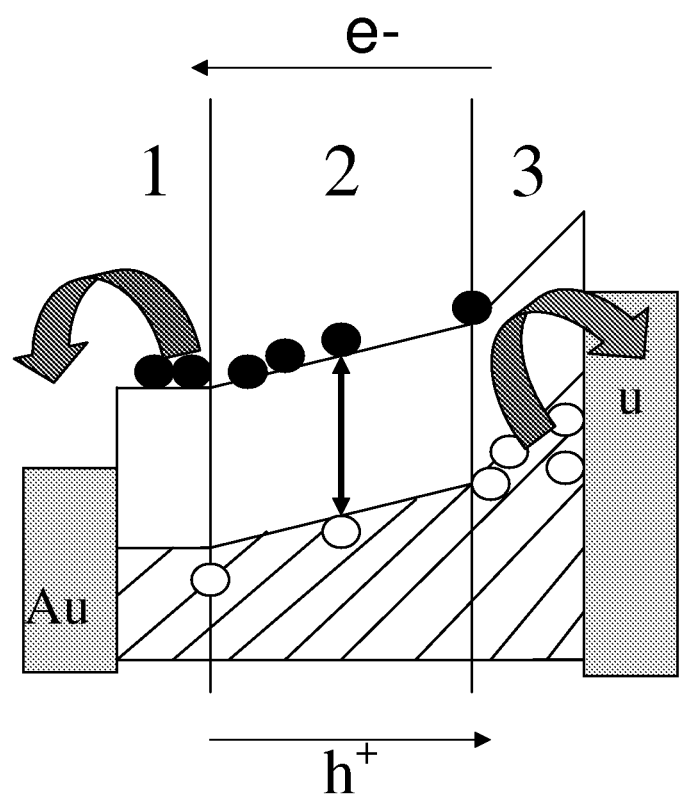
FIG. 13 is a schematic diagram depicting photoconductivity of a device.

FIG. 13 is a schematic diagram depicting photoconductivity in a device. The valence band of bulk CdTe is close to the work function of gold so it may be possible to inject holes into the nanocrystal film from the gold electrodes. The ability to inject charge allows for the study of different electronic transport processes. The secondary photocurrent of the device has a photoconductive gain greater than 1. The device exhibits FET characteristics, and has a steady-state dark current.

Figure 14:
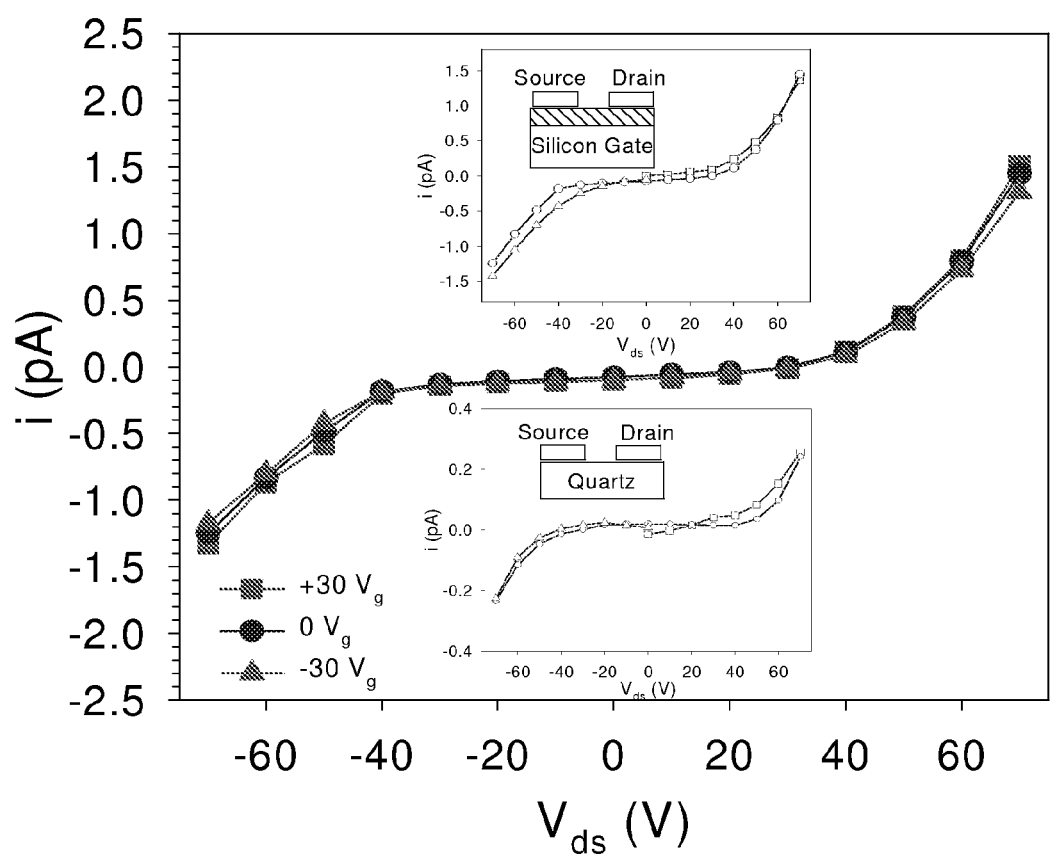
FIG. 14 is graph depicting an i-V curve for a device at room temperature.

FIG. 14 is a graph depicting the i-V curve for a device. At room temperature the i-V curve becomes symmetric and the ability to control the charge density with the gate is lost. Free charges in the film screen the gate. Current behaves as it would on a quartz device with no gate (bottom inset). There is no hysteresis at room temperature and dark current appears to be steady state (top inset).

Figure 15:
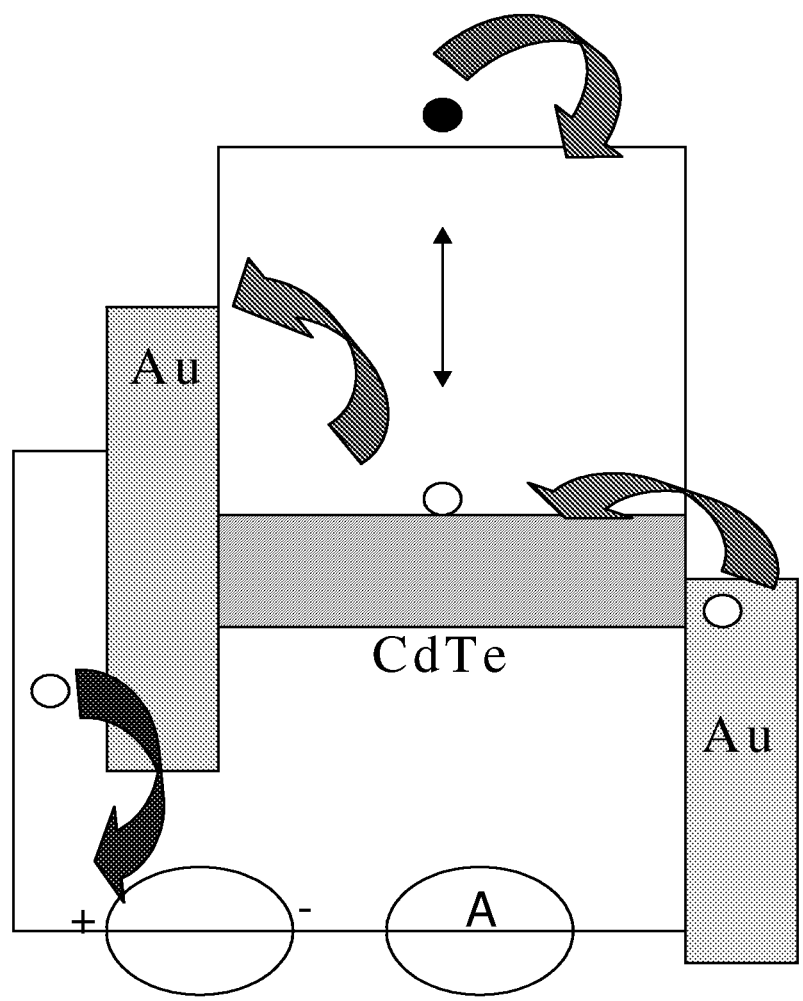
FIG. 15 is a schematic diagram depicting photoconductivity of a device.

FIG. 15 is a schematic depicting photoconductivity of the device. The photoconductive gain is greater than one at 295 K after treatment with butylamine and increases with applied voltage. A gain higher than one and non-blocking contacts designate the photocurrent as secondary in CdTe QD films. Secondary photocurrent in bulk semiconductors goes as $$i = \frac{e \cdot F \cdot (\mu_n + \mu_p) \cdot \tau \cdot V}{L^2} \quad (9)$$

At high voltages all of the electrons reach the electrode and the current saturates with voltage. The gain has a value equal to the ratio of the mobility of the two carriers $$i = e \cdot F \cdot \frac{\mu_p}{\mu_n} \quad (10)$$

As the mobility of electrons is greater than that of holes in bulk CdTe, they should reach the electrode before the holes have a chance to cycle through the circuit and amplify the current. The fact that amplification and no saturation are observed implies the mobility of electrons in the CdTe QD is reduced possibly due to interaction with trapping centers.

The ability of gold electrodes to inject holes into CdTe nanocrystal films results in dark and photocurrents which behave differently than those previously observed in CdSe nanocrystal films. The device behaves as a p-type FET at 87 K. Electrons, freed from traps at room temperature, screen the gate. This results in a room temperature steady-state dark current, due to injected holes, that is symmetric with drain bias and no longer is affected by the gate voltage. The dark current at room temperature increases by three orders of magnitude after treatment with butylamine and is symmetric with drain bias. The conduction mechanism is a combination of tunneling and thermally activated hopping from a surface trap site located ~20 Å from the nanocrystal core. The injection of holes and low electron mobility in the CdTe nanocrystal films allows for the generation of secondary photocurrents with a gain greater than 1. The voltage dependence of the photocurrent is temperature independent and results from holes tunneling from nanocrystal to nanocrystal. The increase in the magnitude of the photocurrent with temperature is due to an increase in carrier density as holes no longer recombine with trapped electrons as the temperature increases.

Other embodiments are within the scope of the following claims.

What is claimed is:

1. An electro-optical device comprising a first electrode and a second electrode, the first electrode and the second electrode being positioned on a surface of a substrate, a plurality of nanocrystals positioned between the first electrode and the second electrode, and a third electrode positioned on the substrate and opposite the first electrode and second electrode, each nanocrystal and at least one electrode having a band gap offset sufficient to inject a charge carrier from the first electrode or second electrode into the nanocrystal, wherein at least one of the valence band and the conduction band of each nanocrystal is intermediate in energy to the allowed band energies of at least one electrode, and wherein the device is a secondary photoconductor configured such that one carrier is more mobile than the other and the more mobile carrier can be injected from the first or second electrode, and wherein the substrate or third electrode is transparent.

2. The electro-optical device of claim 1, wherein the nanocrystal is a CdTe nanocrystal.

3. The electro-optical device of claim 1, wherein the first electrode and the second electrode are gold.

4. The electro-optical device of claim 3, wherein the nanocrystal is a CdTe nanocrystal.

5. The electro-optical device of claim 1, wherein the substrate is a dielectric layer.

6. The electro-optical device of claim 1 wherein the plurality of nanocrystals form a layer.

7. The electro-optical device of claim 1, wherein the device has a photoconductive gain of at least 10.

\* \* \* \* \*